United States Patent
Maitani et al.

[11] Patent Number: 5,986,242
[45] Date of Patent: Nov. 16, 1999

[54] HEATER CONTROL DEVICE USING PHASE ANGLE CONTROL

[75] Inventors: Yoshifumi Maitani; Yukinari Sato, both of Soraku-gun; Michiaki Nishimura, Yoshino-gun; Junichi Kajiwara, Nara, all of Japan

[73] Assignee: Sharp Kabushiki Kaisha, Osaka, Japan

[21] Appl. No.: 09/057,612

[22] Filed: Apr. 9, 1998

[30] Foreign Application Priority Data

Jun. 2, 1997  [JP]  Japan ..................... 9-144257

[51] Int. Cl.[6] ...................................... H05B 1/02
[52] U.S. Cl. ................. 219/501; 323/239; 323/235
[58] Field of Search .................. 219/501, 505, 219/503, 508, 492, 497; 323/908, 299, 901, 235, 319, 320, 239; 363/149

[56] References Cited

U.S. PATENT DOCUMENTS

| | | |
|---|---|---|
| 3,859,591 | 1/1975 | Saunders . |
| 4,218,648 | 8/1980 | Samsum . |
| 4,276,486 | 6/1981 | Ahuja et al. . |
| 4,311,956 | 1/1982 | Tolmie, Jr. . |
| 4,357,645 | 11/1982 | Lilienthal . |
| 4,485,296 | 11/1984 | Ueda et al. ............... 219/505 |
| 4,574,230 | 3/1986 | Masaki . |
| 5,079,409 | 1/1992 | Takada et al. ............ 219/497 |
| 5,789,723 | 8/1998 | Hirst ........................ 219/501 |
| 5,847,555 | 12/1998 | Lewis ....................... 323/299 |
| 5,880,578 | 3/1999 | Oliverira et al. ......... 232/235 |

FOREIGN PATENT DOCUMENTS

| | | |
|---|---|---|
| 0 429 523/a2 | 4/1991 | European Pat. Off. . |
| 2 261 084 | 5/1993 | European Pat. Off. . |
| 3-266008 | 11/1991 | Japan . |
| WO 87/03713 | 6/1987 | WIPO . |

*Primary Examiner*—Philip H. Leung
*Assistant Examiner*—Jeffrey Pwu
*Attorney, Agent, or Firm*—Nixon & Vanderhye P.C.

[57] ABSTRACT

The control circuit includes: a series circuit of a first triac and a reactor; and a second triac in parallel with this series circuit so as to perform control of activation of a fixing heater. Since the fixing heater has a low resistance when the power switch is first turned on, the first triac is operated to perform phase angle control of current flow, and when the phase angle has become approximately equal to 180°, the first triac is stopped, at the same time the second triac starts to be operated. The switching from the first triac to the second triac is made quickly so that it is possible to reduce the power consumption from the reactor.

19 Claims, 19 Drawing Sheets

FIG. 5
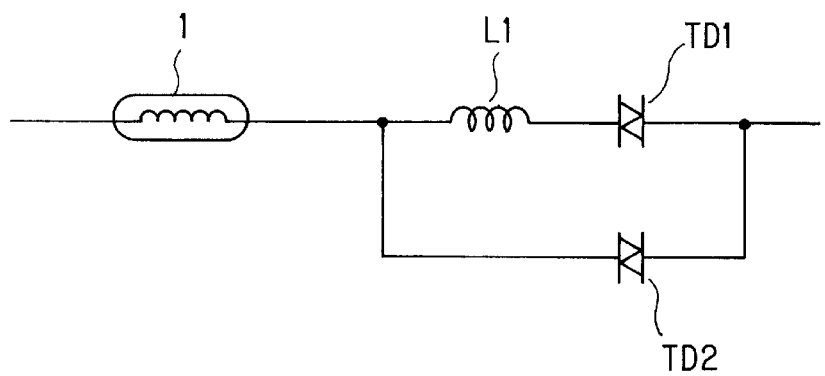
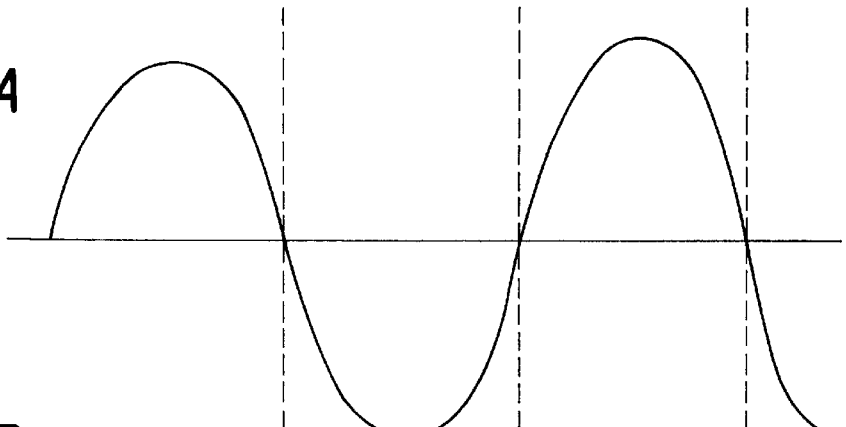
FIG. 7A
AC input voltage
FIG. 7B
Zero-cross signal
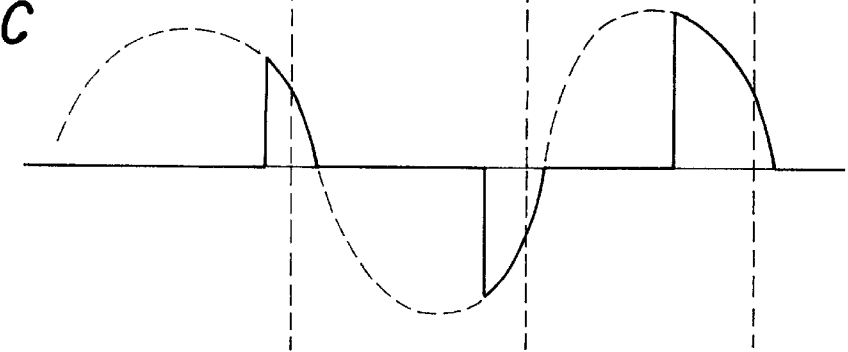
FIG. 7C
Actual current

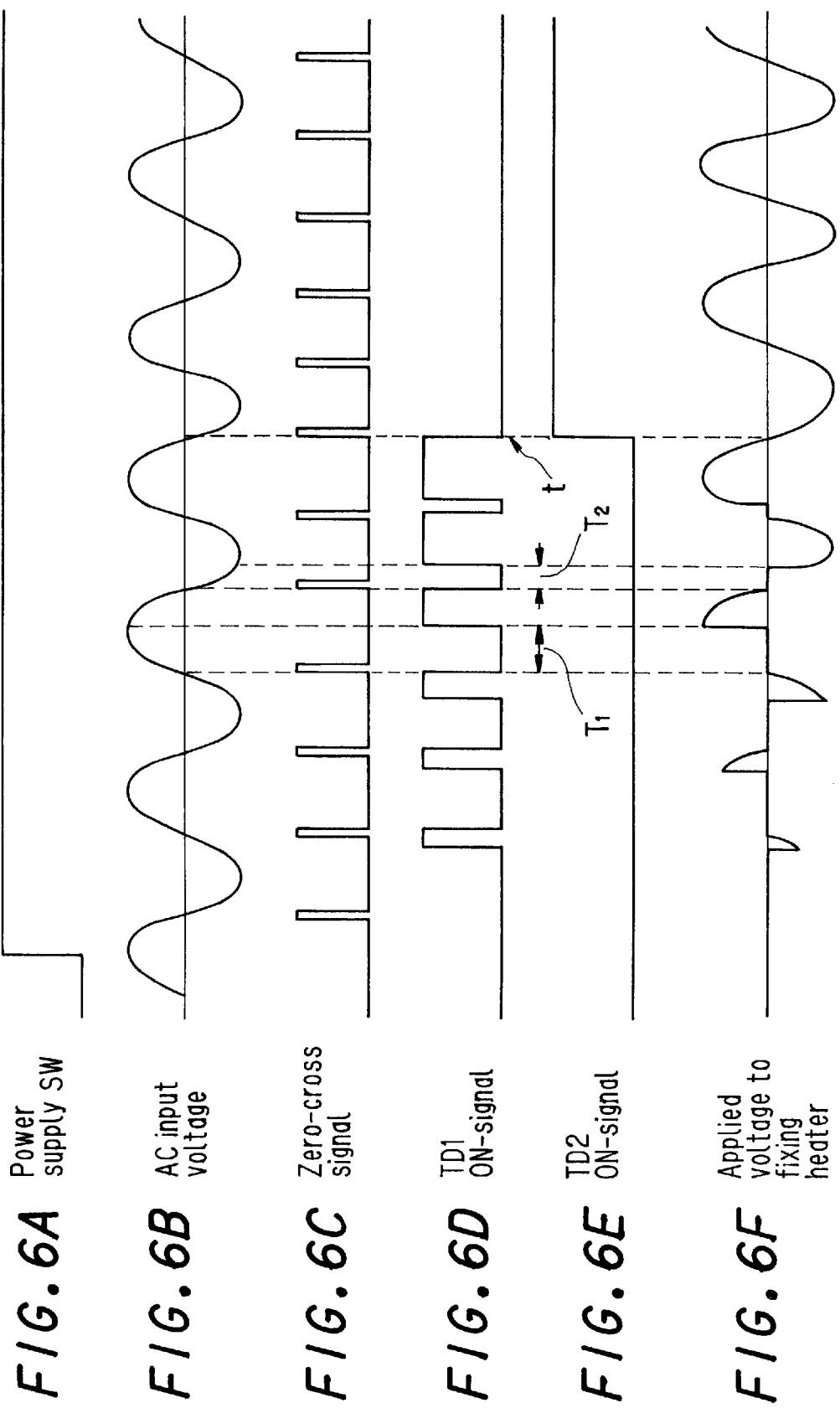

HEATER CONTROL DEVICE USING PHASE ANGLE CONTROL

BACKGROUND OF THE INVENTION

(1) Field of the Invention

The present invention relates to a heater control device that controls a heater in which an intensive rush current arises, and more particularly relates to a heater control device which is suitable for an image forming apparatus such as a copier, laser beam printer, facsimile machine etc., in which a halogen lamp is used for the fixing heater.

(2) Description of the Prior Art

Referring to FIGS. 1 and 2, a conventional example will be explained.

In conventional image forming apparatuses such as copiers, laser beam printers, facsimile machines, etc., a fixing heater 1 using a halogen lamp etc. which generates intensive rush current is most commonly adapted to be activated at the zero-cross point, in order to reduce the noise flowing out from the a.c. cable to the power supply line as much as possible.

Even with the above countermeasure, fixing heater 1 in a circuit configuration as shown in FIG. 1 has very low resistivity value when the filament of the fixing heater remains cold, so that a very large rush current occurs at the moment fixing heater 1 is activated. In order to suppress the rush current this configuration needs a triac TD, which is rather expensive and also suffers from a problem that large variation of the power source voltage occurs.

To take countermeasures against the aforementioned variations of the power source voltage, there is a method by which fixing heater 1 is activated by gradually making the phase angle of current flow greater, using a reactor L in series between fixing heater and triac TD as shown in FIG. 2. This method, however, includes the problem of occurrence of a large higher-harmonic current because a large amount of current flows through fixing heater 1 during the control of the phase angle of the current through fixing heater 1.

The variation of the power source voltage causes fluctuation, and the higher-harmonic current affects the operations of other appliances by way of the power system. Therefore, in Europe, for example, the international standard (IEC1000-3-2, IEC1000-3-3) concerning EMC has been laid down by force by the IEC since Jan. 1, 1996. Under this rule, new regulations concerning fluctuation and higher harmonics will be started from 1998.

Now, reference will be made to the EC's regulations against higher harmonics and flicker of fluctuation.

First, the regulation for higher harmonics is to regulate higher-harmonic components of the input current to the appliances connected to the power supply, in order to prevent disorders as follows. More specifically, when an electronic appliance is connected to the power system, higher-harmonic current occurs in the power source due to the components whose input power source is not of a sinusoidal current, such as the power source rectifier circuit, phase control circuit, components having non-linear load characteristics and the like, thus causing voltage distortion. This voltage distortion, in turn, affects power system equipment as well as the operations of the appliances connected to the power system, thus causing overheating, burnout and/or generation of noise in the capacitors, inductors and transformers, malfunctions of the control devices, operation failures and shortening of the lifetime of the connected appliances, and other defects.

Secondly, the regulation against flicker is the one which prevents flickering of illumination due to variations of the power supply voltage occurring with the changes in the consumed current of appliances being connected to the power source, and regulates the magnitude of the voltage drop, its duration and frequency of changes per min. when an appliance is operated under the power source impedance as the reference. In this point of view, in the case where an appliance such as a copier employing a halogen lamp of high power as the fixing heater is used, the rush current when the fixing heater is activated, is of major influence, therefore, this rush current needs to be reduced.

As a countermeasure against this, it is disclosed in Japanese Patent Application Laid-open Hei 3 No. 266,008, for example, that the outstanding large rush current which will occur when the fixing heater is activated is prevented by providing a temperature detecting means in the fixing heater, and turning on the thyristor at a zero-cross point in the a.c. input voltage waveform when the detected temperature is low while, if the detecting temperature is high, activating the thyristor at a phase after and around the peak of the a.c. input voltage waveform.

However, the fixing heater using a halogen lamp etc., will cause a rush current every time the heater is activated, this needs use of a control device such as triac etc., having a rated current greater than that required for the control, resulting in increase in cost. Further, there is a concern that this large rush current might cause fluctuation such as flicker of fluorescent lamps connected to the same power system as the copier.

To solve this problem, there is a method of performing a soft start of the activation of the fixing heater by performing phase angle control. This method, however, is accompanied with a large higher-harmonic current, needing a reactor which must be connected in series with the fixing heater. The size of the reactor is determined by its inductance value and average current (the amount of heat generation). Therefore, if it is used with a halogen lamp etc. which has a high current load, the reactor needed becomes larger and heavier and more expensive, hindering the reduction in size and cost of the copier.

SUMMARY OF THE INVENTION

It is therefore an object of the present invention to provide a heater control device which can reduce generation of higher-harmonic current and hence generation of fluctuation or flicker, with a small-sized reactor that needs a limited average current for reducing the higher-harmonic current.

In order to achieve the above object, the present invention is configurated as follows:

In accordance with the first aspect of the invention, a heater control device for controlling a heater based on phase angle control, comprises:

a heater control circuit consisting of a series circuit of a first phase control switch and a reactor and a second phase control switch connected in parallel with the series circuit, the heater control circuit being connected in series with a heater;

a detecting means for detecting the zero-cross points in the waveform of an a.c. input voltage supplied to the heater; and a phase angle control means, which based on the detection output of the zero-cross points from the detecting means, gradually alters the phase angle of current flow from the minimum range to the maximum range, and is characterized in that the phase angle control means performs control in such a manner that only the first phase control switch is turned on until the phase angle of the current flow reaches 180° and then only the second phase control switch is turned on after the phase angle of the current flow has reached 180°.

In accordance with the second aspect of the invention, the heater control device having the above first feature is characterized in that:

the reactor has the secondary winding wound on the common core;

the detecting means detects the zero-cross points from the output voltage from the secondary winding;

a timer means is provided for measuring time, starting the measurement at a zero-cross point on the a.c. input voltage waveform detected by detecting means; and the first phase control switch performs phase angle control, by gradually altering the phase angle of current flow from the minimum range to the maximum range, based on the measured time from the timer means.

In accordance with the third aspect of the invention, the heater control device having the above first feature is characterized in that the reactor has the secondary winding wound on the common core, and further includes an anomaly detecting means for detecting the anomaly of the first phase control switch, based on the output voltage from the secondary winding.

In accordance with the fourth aspect of the invention, a heater control device for controlling a heater based on phase angle control, includes:

a heater control circuit consisting of a series circuit of a first phase control switch and a reactor and a second phase control switch which shares in part the winding of the reactor and is connected in parallel with the series circuit, the heater control circuit being connected in series with a heater;

a detecting means for detecting the zero-cross points in the waveform of an a.c. input voltage supplied to the heater; and a phase angle control means, which based on the detection output of the zero-cross points from the detecting means, gradually alters the phase angle of current flow from the minimum range to the maximum range, and is characterized in that the phase angle control means performs control in such a manner that only the first phase control switch is turned on until the phase angle of the current flow reaches 180° and then only the second phase control switch is turned on after the phase angle of the current flow has reached 180°.

In accordance with the fifth aspect of the invention, the heater control device having the above fourth feature is characterized in that the reactor has the secondary winding wound on the common core, and further includes an anomaly detecting means for detecting the anomaly of the first phase control switch and the second phase control switch, based on the output voltage from the secondary winding.

In accordance with the sixth aspect of the invention, the heater control device having the above first feature is characterized in that a load which generates higher-harmonic current is adapted to be connected in parallel with the series circuit of the first phase control switch and the heater.

In accordance with the seventh aspect of the invention, the heater control device having the above first feature is characterized in that a load which generates higher-harmonic current is connected at a midway point of the winding of the reactor so that the load is connected in parallel with the series circuit of a part of reactor, the first phase control switch and the heater.

In accordance with the eighth aspect of the invention, a heater control device for controlling a heater based on phase angle control, comprises:

a heater control circuit consisting of a series of a reactor, a first phase control switch and a resistor and a second phase control switch in parallel with the series circuit, the heater control circuit being connected in series with a heater;

a detecting means for detecting the zero-cross points in the waveform of an a.c. input voltage supplied to the heater; and a phase angle control means, which based on the detection output of the zero-cross points from the detecting means, gradually alters the phase angle of current flow from the minimum range to the maximum range, and is characterized in that the phase angle control means performs control in such a manner that only the first phase control switch is turned on until the phase angle of the current flow reaches 180° and then only the second phase control switch is turned on after the phase angle of the current flow has reached 180°.

In accordance with the ninth aspect of the invention, the heater control device having the above first feature is characterized in that the first phase control switch has two classes of operation time during which the first phase control switch is changed over to the second phase control switch, so that when the heater is cold, the operation time of the first phase control switch for altering the phase angle of current flow from the minimum range to the maximum range is made long, whereas when in the regular temperature condition, the operation time is made short.

In accordance with the tenth aspect of the invention, a heater control device for controlling a heater based on phase angle control, comprises:

a first heater control circuit consisting of a series circuit of a first phase control switch and a reactor and a second phase control switch connected in parallel with the series circuit, the first heater control circuit being connected in series with a first heater;

a first detecting means for detecting the zero-cross points in the waveform of an a.c. input voltage supplied to the first heater;

a phase angle control means, which based on the detection output of the zero-cross points from the first detecting means, gradually alters the phase angle of the current flowing through the first phase control switch, from the minimum range to the maximum range, wherein the phase angle control means performs control in such a manner that only the first phase control switch is turned on until the phase angle of the current flow reaches 180° and then only the second phase control switch is turned on after the phase angle of the current flow has reached 180°;

a second heater control circuit consisting of a series circuit of a third phase control switch and a reactor and a fourth phase control switch connected in parallel with the series circuit, the second heater control circuit being connected in series with a second heater;

a second detecting means for detecting the zero-cross points in the waveform of an a.c. input voltage supplied to the second heater; and a phase angle control means, which based on the detection output of the zero-cross points from the second detecting means, gradually alters the phase angle of the current flowing through the third phase control switch, from the minimum range to the maximum range, wherein the phase angle control means performs control in such a manner that only the third phase control switch is turned on until the phase angle of the current flow reaches 180° and then only the fourth phase control switch is turned on after the phase angle of the current flow has reached 180°.

In accordance with the first configuration, a plurality of phase control switches (to be referred to as triacs') are connected to the heater. The first triac is connected in series with a reactor of a small current capacity while the second triac is directly connected to the heater without any reactor. The first triac is used only for the period of the soft start at the initial activation of the heater to thereby markedly shorten the time for the reactor to generate current, thus to suppressing the average current flowing through the reactor to a low level.

In accordance with the second configuration, it is possible to perform delicate control of the a.c. input current and the heater current and hence to reduce fluctuation.

In accordance with the third configuration, the use of the secondary winding of the reactor facilitates the anomaly detection of the first triac.

In accordance with the fourth configuration, it is possible to detect anomaly of the second triac.

In accordance with the fifth configuration, it is possible to take measures against the aforementioned generation of higher-harmonic current and noise from the second triac.

The sixth configuration has the effect as follows. When a capacitor input type power source such as a switching power source, etc. is used for the d.c. power source for controlling the whole copier, higher-harmonic current also arises from this d.c. power source. In this case, the existing reactor is also used as the reactor for the d.c. power source thus eliminating the necessity of a separate countermeasure for the d.c. power source.

In accordance with the seventh configuration, since the load of the d.c. power source and other loads than the heater are small, the partial use of the winding of the reactor is effective enough, thus making it possible to reduce the average current of the reactor as a whole.

In accordance with the eighth configuration, the peak value of the rush current at the time of activation of the heater when the heater is still low in temperature is high even if the soft start is performed based on the control of the phase angle for current flow. In this configuration, a resistor is connected in series to the reactor and the first triac, so as to reduce the flicker value.

In accordance with the ninth configuration, when the heater which is low in temperature when the power switch is activated starts to be heated, the soft start based on the phase angle control of current flow is performed in a longer period of time so as to inhibit fluctuation. On the other hand, a shorter phase angle control of current flow is performed in the regular temperature control, thus suppressing generation of heat from the reactor.

In accordance with the tenth configuration, main and auxiliary heaters are used to as to reduce the warm-up time when the power switch is activated and as well as reducing the power consumption during the regular temperature control mode. Further, since the heater of a smaller power rating is used when the regular temperature control is performed, it is possible to reduce the rush current at the start of activation of the heater as well as reducing the number of repetitions of activation of the heater. Accordingly, it is possible to reduce the flicker value.

BRIEF DESCRIPTION OF THE DRAWINGS

FIG. 5 is a diagram showing the basic configuration of the fixing heater control circuit in accordance with the first embodiment;

FIGS. 6A–6F are charts showing the waveforms against time in accordance with the first embodiment;

FIGS. 7A–7C are diagrams of waveforms showing the relationship of the a.c. input voltage, zero-cross points, the current flowing through reactor L1 and triac TD1, in accordance with the first embodiment;

DESCRIPTION OF THE PREFERRED EMBODIMENTS

The embodiments of the invention will hereinafter be described exemplifying an electrostatic copier.

The 1st Embodiment

Referring to FIGS. 3 through 6, the first embodiment will be explained.

Figure 1:
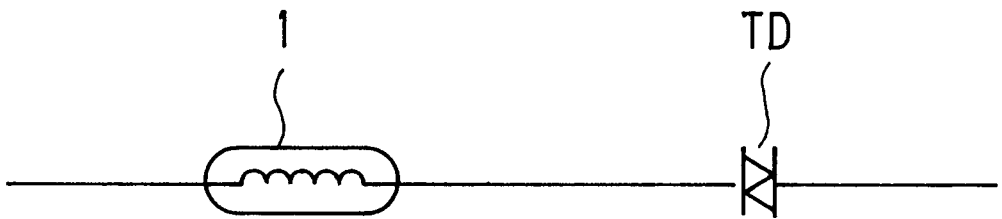
FIG. 1 is a diagram showing the basic configuration of a conventional fixing heater control circuit.
Figure 2:
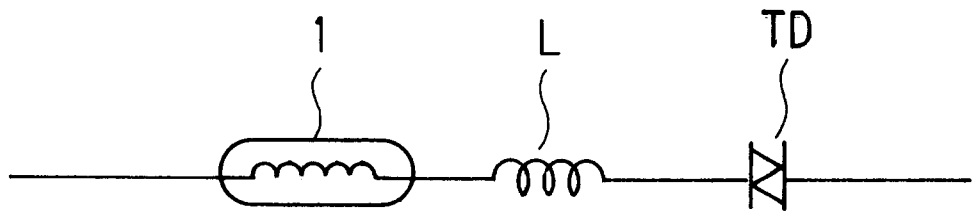
FIG. 2 is a diagram showing the basic configuration of another conventional fixing heater control circuit.
Figure 3:
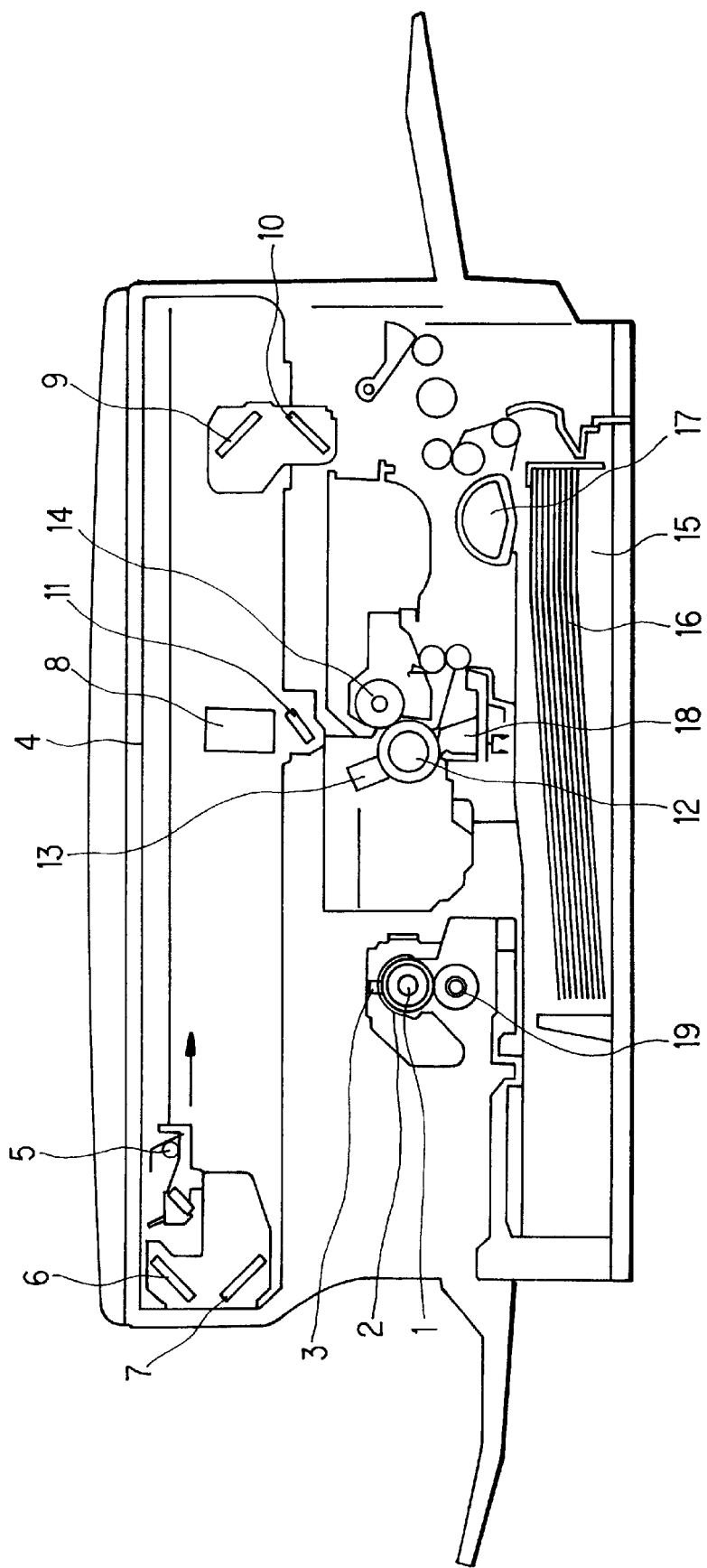
FIG. 3 is a sectional view showing basic components of a copier in accordance with the present invention.

FIG. 3 is a sectional view showing the basic configuration of a copier in accordance with this embodiment.

When the user activates the power switch, a d.c. power source (not shown) starts to operate, activating the circuits. As the circuits start to operate, a fixing heater 1 incorporated in a fixing roller 2 is activated. The temperature of fixing roller 2 is detected by a thermistor 3. When the temperature reaches the predetermined level, fixing heater 1 is turned off and the operation state of the copier is set into the ready mode maintaining the copy operable state. Then, fixing heater 1 is repeatedly turned on and off to keep the temperature constant.

The copying operation is started by pressing the copy switch on an unillustrated control panel with an original set on an original table 4 made up of hard glass. In response to the signal from the copy switch, an illuminating lamp 5 illuminates the original on original table 4, whilst moving. The light radiated is reflected by the original and then reflected by mirrors 6 and 7, passing through a lens 8, further reflected by mirrors 9, 10 and 11, to be focused on a photoreceptor 12.

Photoreceptor 12 is uniformly charged by corona discharge generated from a main charger 13. When photoreceptor 12 has been exposed to the focused light of the image of the original, a static latent image is formed on the photoreceptor, by retaining the charge corresponding to the intensity of the light radiated. The toner supported on a magnet roller 14, which is kept at a predetermined voltage relative to the static latent image, is attracted to photoreceptor 12 by the Coulomb force derived from the potential difference relative to the static latent image, thus the static latent image on photoreceptor 12 is visualized with the toner.

Copy paper 16 set in a paper cassette 15 is picked up by a feed roller 17 and fed between a transfer device 18 and photoreceptor 12. The developed image formed on photoreceptor 12 is transferred to copy paper 16 by the Coulomb force, which is generated by the corona discharge from transfer device 18, then copy paper 16 is heated and pressed between a fixing roller 2, which is heated by fixing heater 1, and opposing fixing roller 19, so that the toner is fused and fixed to copy paper 16.

Figure 4:
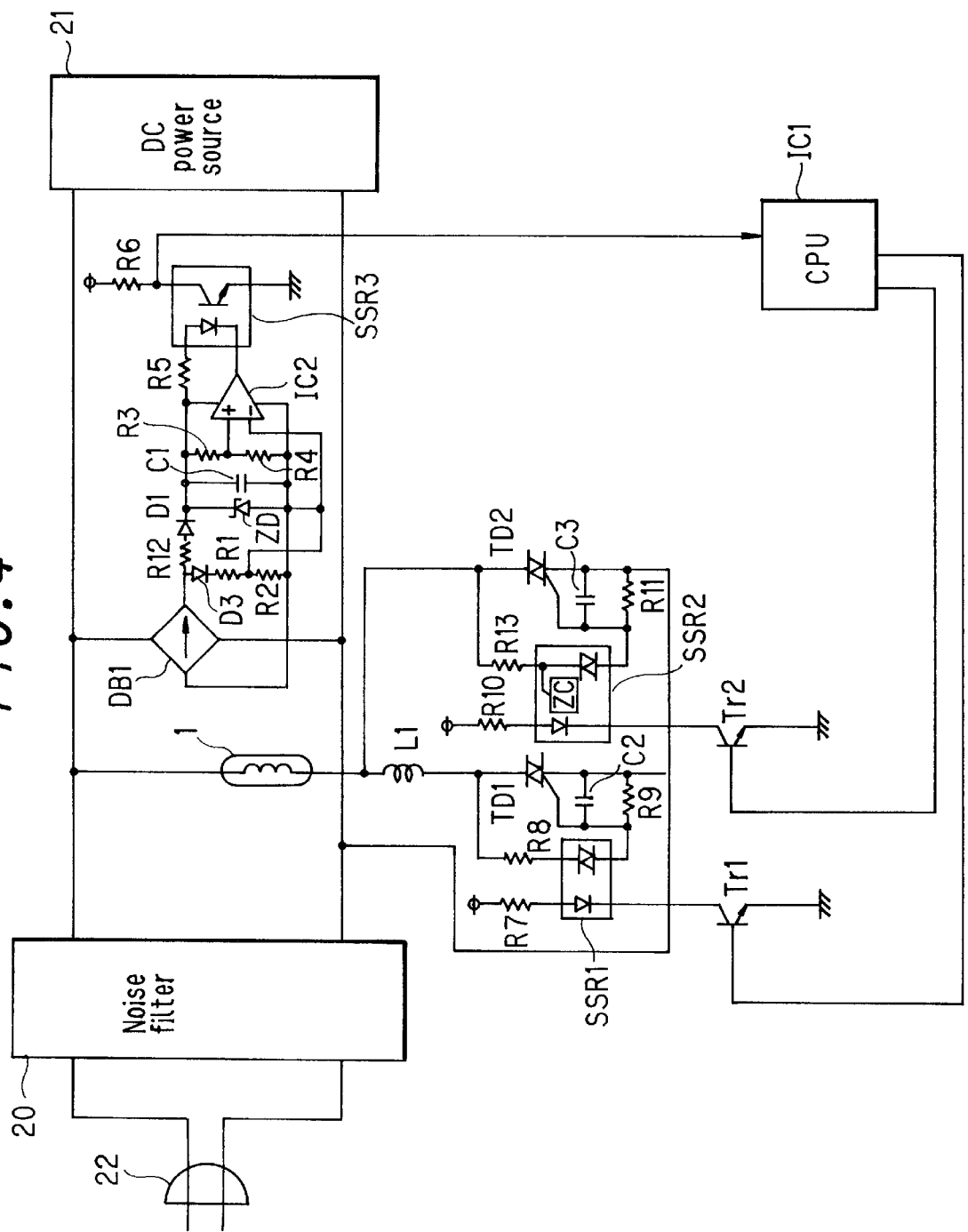
FIG. 4 is a block diagram showing the fixing heater control circuit in accordance with the first embodiment.

FIG. 4 is a block diagram showing the control circuit of fixing heater 1 of the first embodiment.

An a.c. voltage input from an a.c. plug 22 is input to a d.c. power source 21 through a noise filter 20. The d.c. voltage generated from d.c. power source 21 supplies the power to a CPU IC1 etc. The a.c. input voltage is rectified by a diode bridge DB1 to become a pulsating voltage of half-waves. This pulsating voltage is voltage divided by resistors R1 and R2, and the divided level is compared in a comparator IC2 with the reference voltage produced by ZD1, resistors R3 and R4. If the pulsating voltage becomes lower than the reference voltage, this indicates that the a.c. input voltage is approaching a zero-cross point. Therefore, the output from comparator IC2 is used to turn on a photocoupler SSR3. When photocoupler SSR3 becomes active, the logical state at the terminal of a resistor R6 connected to CPU IC1 changes from '1' to '0', and CPU IC1 performs phase angle control based on this signal.

FIG. 5 is a diagram showing the basic configuration of fixing heater 1 in the first embodiment. The circuit comprises: a series circuit of a first triac TD1 and a reactor L1; a second triac TD2 in parallel with this series circuit; and a fixing heater 1 connected in series with this parallel circuit. Only during the time when fixing heater 1 is soft started by phase control, the first triac TD1 is caused to operate and use reactor L1. After the duration of the soft start, the second triac TD2 is caused to operate while the use of reactor L1 is stopped. This manipulation regulates the rush current to fixing heater 1 when the fixing heater is low in temperature and therefore low in resistance. Thereafter, as the resistance becomes greater with the elevation in temperature of fixing heater 1 by the current flow, the flow of the current is switched to the path through the second triac TD2. Since the current mode is switched quickly from the first triac TD1 to the second triac TD2, the amount of heat generated from reactor L1 is small and hence a smaller reactor can be used, thus making it possible to efficiently perform soft start of fixing heater 1.

Referring next to FIGS. 6A–6F, the aforementioned control will be described in further detail.

When the power switch is turned on (FIG. 6A), the a.c. input voltage (FIG. 6B) is input. When the zero-cross point signal is input to CPU IC1 (FIG. 6C), the interval between the pulses of the zero-cross signal is measured so as to determine which is the interval of the zero-cross signal, 8 msec. or 10 msec. This is to identify the type of the power supply system, i.e., either 50 Hz or 60 Hz, so as to set up a counting time from the zero-cross point in association with a respective frequency. The timer starts counting from the zero-cross point. After passage of the predetermined period of time, CPU IC1 instructs a transistor Tr1 to control a phototriac SSR1 so as to activate triac TD1 (FIG. 6D). The time from a zero-cross point to the activation of triac TD1 is gradually made shorter (T1>T2), so that the range of phase angle of the current flowing through fixing heater 1 is gradually widened, thus performing a so-called soft start.

Thereafter, at a time 't' when the phase angle of current flow is maximized, or when the start of current flow coincides the zero-cross point of the a.c. input voltage waveform, triac TD1 is deactivated while triac TD2 is activated. Phototriac SSR2 for operating triac TD2 is of a built-in zero-cross circuit type, and is one which is turned on only near the zero-cross points in the a.c. input voltage waveform.

Next, when thermistor 3 has detected that fixing roller 2 is at a temperature above the predetermined level, CPU IC1 instructs transistor Tr2 to control phototriac SSR2 so as to turn off triac TD2 and hence deactivate heater 1. When thermistor 3 has detected that the fixing roller is at a temperature below the predetermined level, the soft start is started again by using triac TD1. In this manner, fixing roller 2 is kept at a constant temperature.

Thus, the soft start can reduce fluctuation or flicker. The higher-harmonic current generated during this operation can be reduced by reactor L1. The current flow time of reactor L1, or the operation time of triac TD1 is very short so that the heat generation from reactor L1 is low. Further, a smaller reactor can be used compared to the case where a single triac is used for both the soft start and the temperature control. This reactor L1 incorporates a temperature fuse to shut down the connection so as to prevent anomalous elevation in temperature in case of breakdown of triac TD1 or other accidents where current continuously flows.

As has been explained heretofore, in accordance with the first embodiment, the fixing heater is connected in series with a parallel circuit consisting of the reactor and the first triac in series and the second triac, and the first triac is adapted to be used only for the period of the soft start during the initial stage of activation of the fixing heater and the second triac is used for illumination after the range of the phase angle of current flow has been maximized. Therefore, it is possible to limit the average current through the reactor to a low level, and hence the device can be reduced in size and cost.

The 2nd Embodiment

Figure 8:
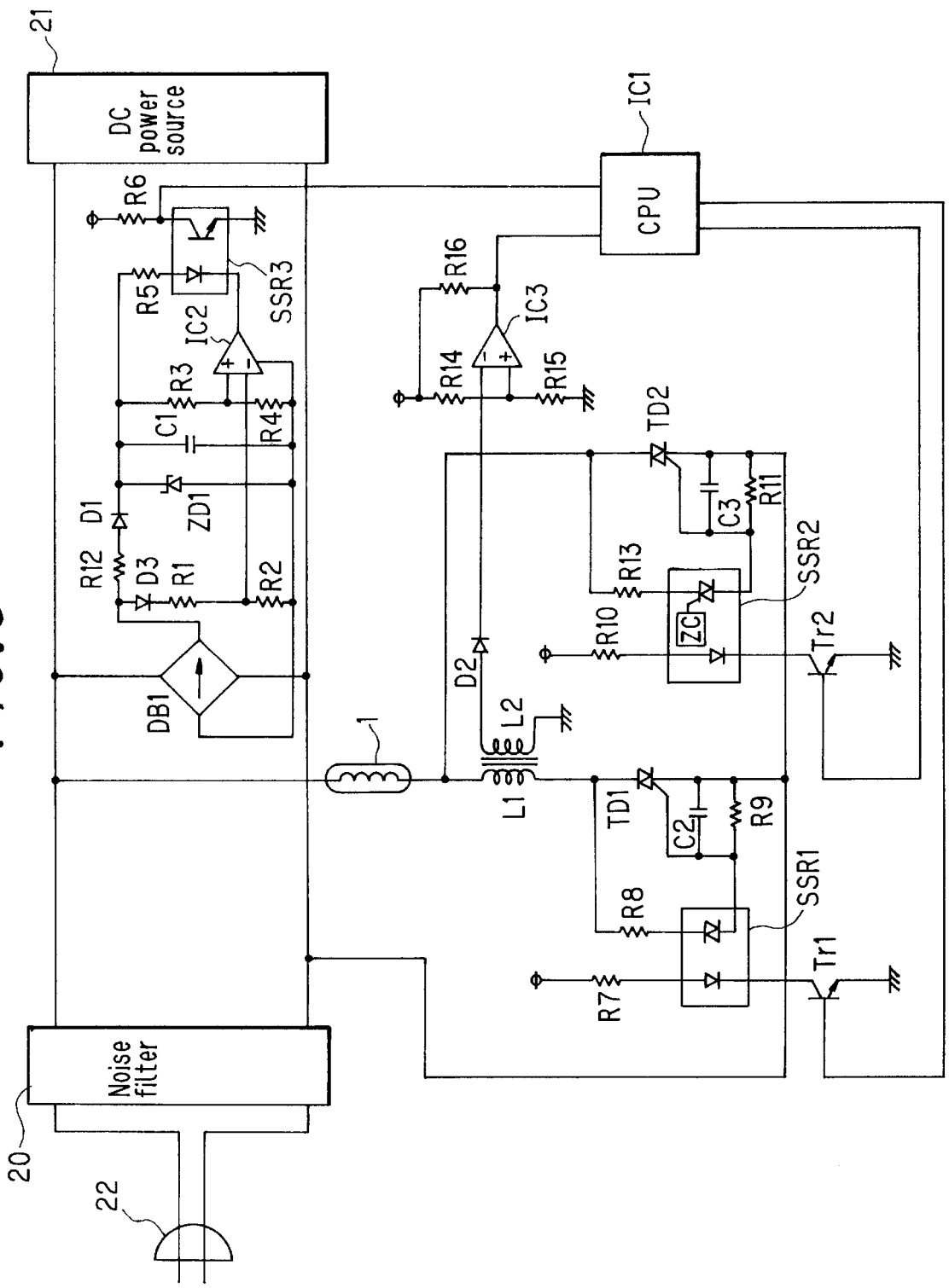
FIG. 8 is a block diagram showing the fixing heater control circuit in accordance with the second embodiment.
Figure 9:
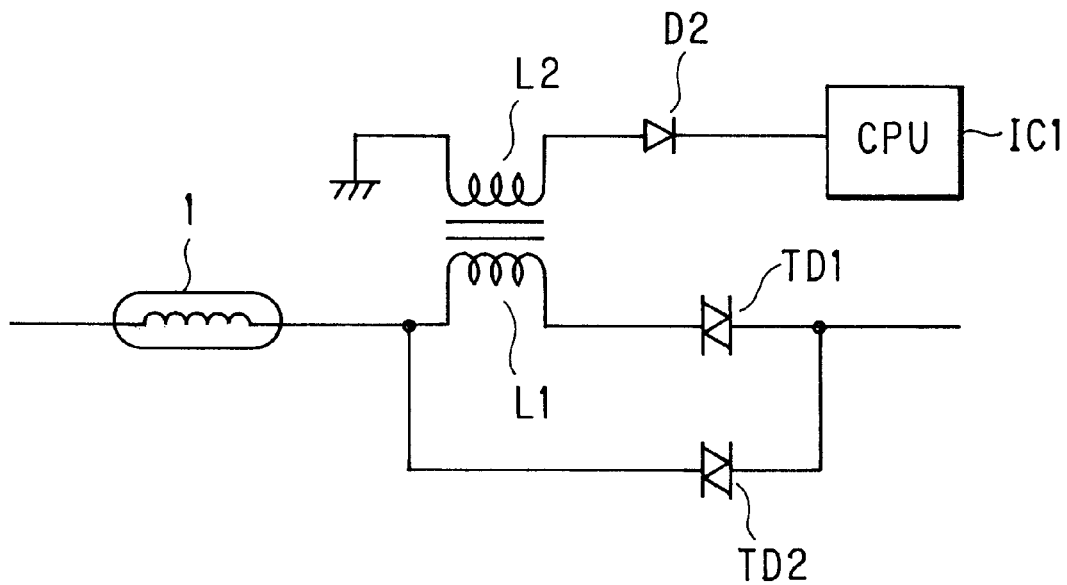
FIG. 9 is a diagram showing the basic configuration of the fixing heater control circuit in accordance with the second embodiment.

Referring to FIGS. 7 through 9, the second embodiment will be explained. FIG. 7 shows the relationship in the first embodiment of the a.c. input voltage (FIG. 7A), the detected zero-cross points (FIG. 7B) and the actual current flowing through reactor L1 and triac TD1 (FIG. 7C). FIG. 8 is a block diagram showing the control circuit of fixing heater 1 in accordance with the second embodiment. FIG. 9 is a diagram showing the basic configuration of a fixing heater control circuit.

As shown in FIGS. 7A–7C, reactor L1 has a very large inductance so that the current lags in phase behind the a.c. input voltage. This phase delay causes triac TD1 to be activated earlier than the originally designated timing of soft start, the current will increase more rapidly, which might degrade the anti-flicker effect in some cases, depending upon the rating of a fixing heater 1 used.

The second embodiment is to deal with the degradation of the effect of reduction of fluctuation, mentioned above. As shown in FIG. 9, the configuration of the second embodiment, in addition to the first embodiment, comprises a second winding L2 opposite reactor L1. The secondary winding L2 is grounded at its one end while the other end is connected to a diode D2. The alternating voltage induced across the second winding L2 is rectified by the diode D2 to become a pulsating d.c. voltage. As shown in FIG. 8, this pulsating voltage is compared in a comparator IC3 with the reference voltage generated by resistors R14 and R15 connected between a d.c. constant voltage source and the ground. If the pulsating voltage becomes lower than the reference voltage, comparator IC3 outputs '1', which is supplied to CPU IC1. Since this voltage signal is synchronized with the phase-delay of the current due to reactor L1, the control of the phase angle of the current through fixing heater 1 is performed based on this signal.

Next, the control operation will be explained. When, in the state where fixing heater 1 is off, fixing heater 1 is activated by thermistor 3 which has detected that the temperature of fixing roller 2 is below the predetermined level, CPU IC1, based on the signal indicating a zero cross point in the a.c. input voltage from phototriac SSR1, outputs a signal for initially activating triac TD1. This first ON current through triac TD1 induces a voltage on the secondary winding L2 of reactor L1, whereby the waveform of the current through reactor L1 is detected as the waveform of the current through the secondary winding L2. The thus induced voltage waveform is compared in comparator IC3 with the reference voltage, and the result is supplied to CPU IC where a correct zero-cross point is detected.

Then, based on the zero-cross point signal from comparator IC3, CPU IC1 gradually makes the phase angle of the current through triac TD1 greater, and turns triac TD1 off and triac TD2 on at the time when the phase angle of the current through triac TD1 has reached 180°. Phototriac SSR2 operating triac TD2 has a zero-cross synchronizing circuit therein so as to be turned on only by the zero-cross point of the a.c. input voltage waveform.

Thereafter, when thermistor 3 detects that the temperature of fixing roller 2 is higher than the predetermined level, triac TD2 is turned off, and then the aforementioned operation will be repeatedly operated when the signal from thermistor 3 indicates that the temperature of fixing roller is lower than the predetermined level.

As has been described heretofore, in accordance with the second embodiment, the waveform of the current through reactor L1 is detected so as to correct the phase delay due to the inductance of reactor L1, whereby the phase angle of the current through triac TD1 is controlled. Therefore, it is possible to perform further delicate soft start of fixing heater 1, and hence to reduce fluctuation or flicker to a lower level.

The 3rd Embodiment

Figure 10:
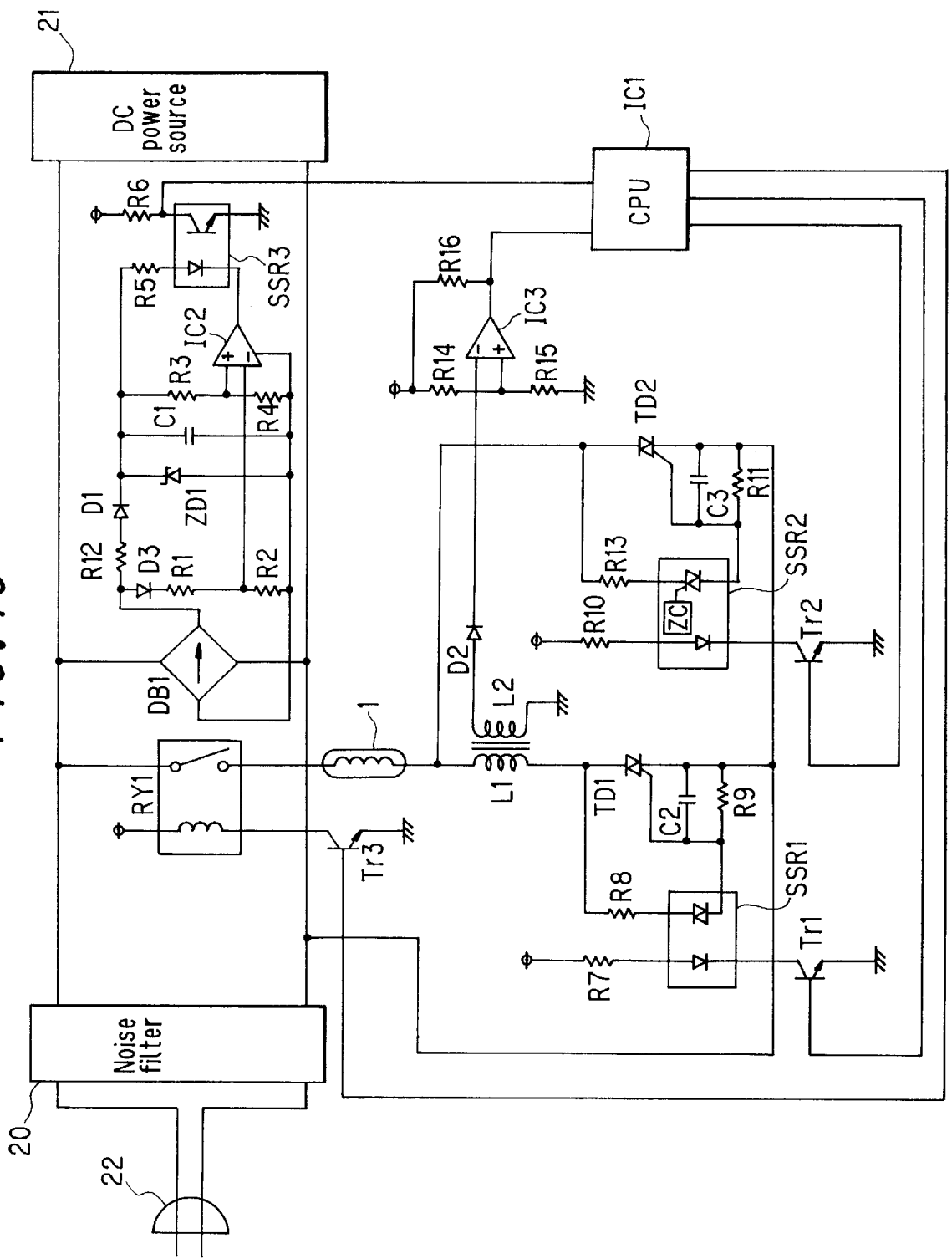
FIG. 10 is a block diagram showing the fixing heater control circuit in accordance with the third embodiment.

Referring to FIG. 10, the third embodiment will be explained. FIG. 10 is a block diagram showing the fixing heater control circuit in accordance with the third embodiment.

Since this configuration uses a reactor having a smaller rated current than that of fixing heater 1, in order to make reactor L1 more compact, there is a need to have protection against occurrence of anomalies such as short circuit of triac TD1, etc.

The configuration of the third embodiment, in addition to the second embodiment, further comprises a relay RY1 connected in series with fixing heater 1, wherein relay RY1 is caused to be open and closed under the control of a transistor Tr3, which is instructed by CPU IC1.

In this embodiment, CPU IC1 continuously monitors the output signal from the secondary winding L2 of reactor L1. That is, when the CPU does not detect the output signal from the secondary winding L2 of reactor L1 while it is outputting the ON signal for triac TD1, the CPU as it recognizes that either of the circuits of fixing heater 1, triac TD1 and reactor L1 is open, outputs an error message and turns off transistor Tr3 so as to release the contact of relay RY1.

If CPU IC1 detects the signal from the secondary winding L2 of reactor L1 in the period during which it is not outputting the ON signal to triac TD1, the CPU, as it recognizes that there is an anomaly such as short circuit of triac TD1 etc., outputs an error message and turns off transistor Tr3 so as to release the contact of relay RY1.

As has been explained, in accordance with the third embodiment, the output signal from the secondary winding L2 of reactor L1 is monitored so as to facilitate the anomaly detection of triac TD1.

The 4th Embodiment

Figure 12:
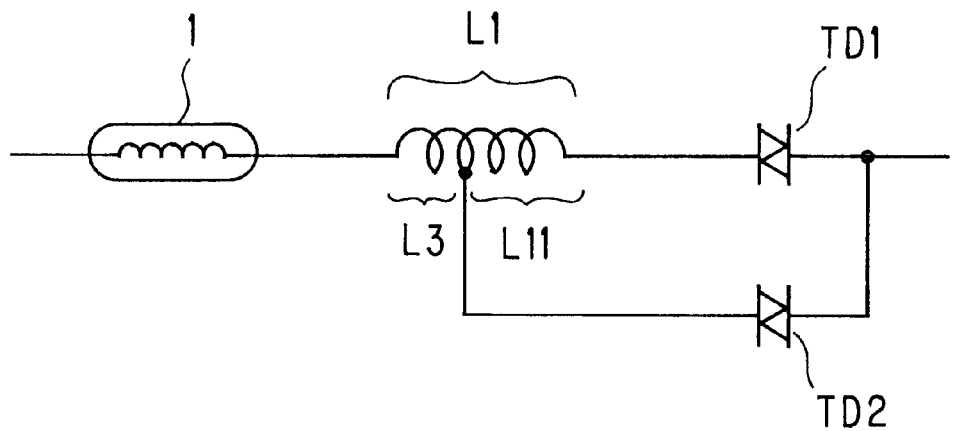
FIG. 12 is a diagram showing the basic configuration of the fixing heater control circuit in accordance with the fourth embodiment.
Figure 11:
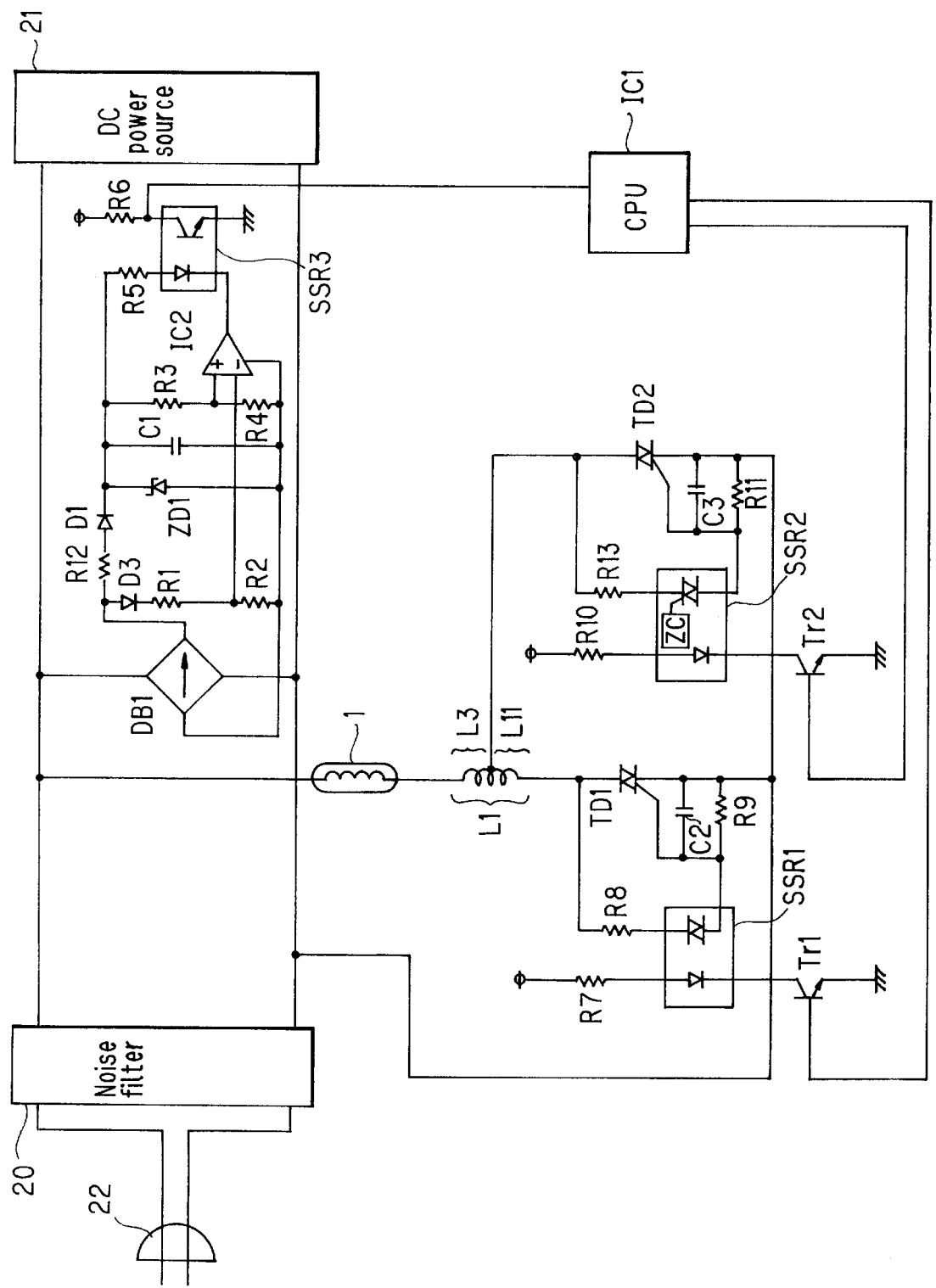
FIG. 11 is a block diagram showing the fixing heater control circuit in accordance with the fourth embodiment.

Referring to FIGS. 11 and 12, the fourth embodiment will be explained. FIG. 11 is a block diagram showing the fixing heater control circuit in accordance with the fourth embodiment. FIG. 12 is a diagram showing the basic configuration of the fixing heater control circuit in accordance with the fourth embodiment.

In the first embodiment, the reactor is not connected in series to triac TD2, which is activated at the zero-cross point. Activation of triac TD2 requires a slight potential difference between its terminals. This means that this triac will not be activated at the zero-cross point in the strict sense. Therefore, at the moment triac TD2 is turned on, some higher-harmonic current may have arisen, causing a fear of a problem of higher-harmonic current in some cases, depending upon the rating of fixing heater 1.

The fourth embodiment is a countermeasure against this problem, having a configuration in which the reactor is also connected in series with triac TD2.

Since the time at which triac TD2 is turned on is very close to the zero-cross point, the higher-harmonic current generated is considered to be small, so that only a very small reactor's inductance is needed as compared to that of reactor L1. Therefore, reactor L1 is configured to be shared in part with triac TD2. In this case, the winding section for reactor L3 in reactor L1 needs to be formed of a thick wire which can withstand the continuous flow of current for fixing heater 1 while the winding part L11 in reactor L1 which is interposed only in the circuit of triac TD1 can be formed of a thin wire as used in the first embodiment.

As has been described, in accordance with the fourth embodiment, it is possible to perform improved reduction of the higher-harmonic current without unnecessarily enlarging the total size of the reactor component, as well as performing anomaly detection of triac TD2.

The 5th Embodiment

Figure 13:
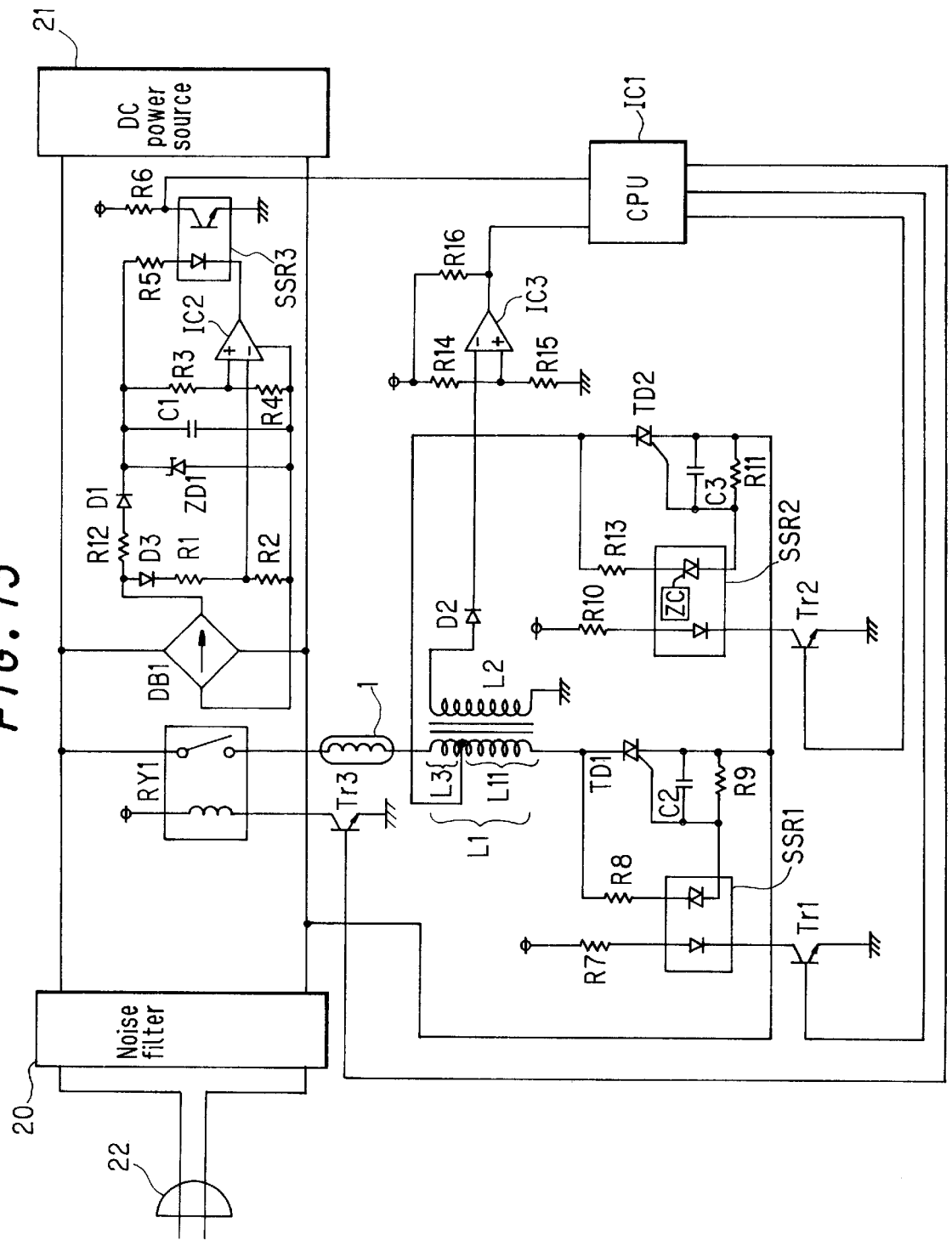
FIG. 13 is a block diagram showing the fixing heater control circuit in accordance with the fifth embodiment.
Figure 14:
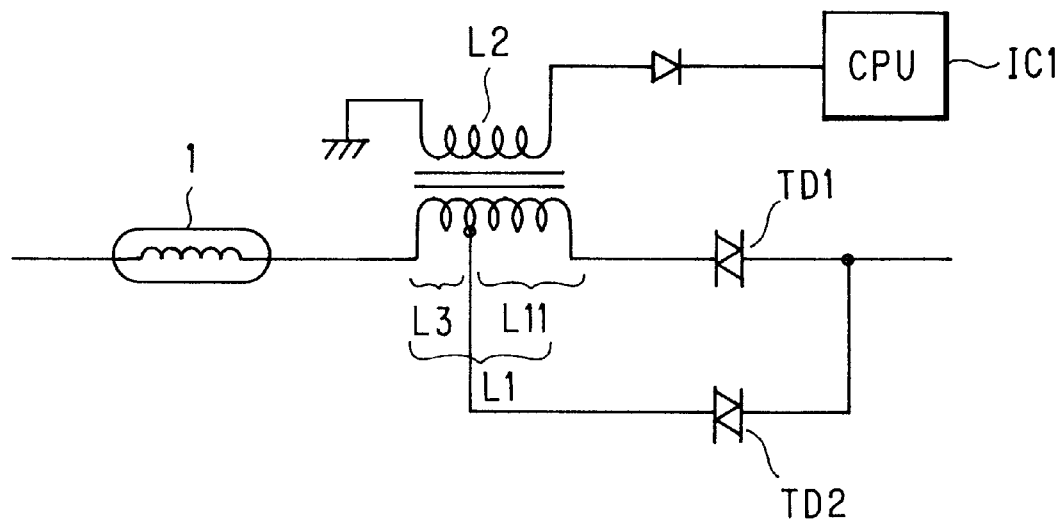
FIG. 14 is a diagram showing the basic configuration of the fixing heater control circuit in accordance with the fifth embodiment.

Referring to FIGS. 13 and 14, the fifth embodiment will be explained. FIG. 13 is a block diagram showing the fixing heater control circuit in accordance with the fifth embodiment. FIG. 14 is a diagram showing the basic configuration of the fixing heater control circuit in accordance with the fifth embodiment.

The configuration of this embodiment further comprises a second winding L2 opposite reactors L1 and L3 in the fourth embodiment. The secondary winding L2 is grounded at its one end while the other end is connected to a diode D2. The voltage induced across the second winding L2 by the current flowing through reactors L1 and L3 is rectified by diode D2 to become a pulsating d.c. voltage. This pulsating voltage is compared in a comparator IC3 with the reference voltage generated by resistors R14 and R15 connected between a d.c. constant voltage source and the ground. If the pulsating voltage becomes lower than the reference voltage, comparator IC3 outputs '1', which is supplied to CPU IC1. In this arrangement, when either triac TD1 or triac TD2 is turned on, a voltage arises across the secondary winding L2, therefore, it is possible to detect that either triac TD1 or triac TD2 has been activated.

The configuration further comprises a relay RY1 connected in series with fixing heater 1, wherein relay RY1 is caused to be open and closed under the control of a transistor Tr3, which is in turn instructed by CPU IC1.

In the fifth embodiment, CPU IC1 continuously monitors the output signal from the secondary winding L2 of reactors L1 and L3. That is, when the CPU does not detect the output signal from the secondary winding L2 of reactors L1 and L3 while it is outputting the ON signal for either triac TD1 or triac TD2, the CPU as it recognizes that either of the circuits of fixing heater 1, triac TD1, triac TD2, reactor L1 and reactor L3 is open, outputs an error message and turns off transistor Tr3 so as to release the contact of relay RY1.

If CPU IC1 detects the signal from the secondary winding L2 of reactors L1 and L3 in the period during which the CPU is not outputting the ON signal to triac TD1, the CPU, as it recognizes that there is an anomaly such as short circuit of triac TD1 or triac TD2, etc., outputs an error message and turns off transistor Tr3 so as to release the contact of relay RY1.

As has been explained, in accordance with the fifth embodiment, the effect of reducing the higher-harmonic current is enhanced and the output signal from the secondary winding L2 is monitored so as to facilitate the anomaly detection of triac TD1 and triac TD2.

The 6th embodiment

Figure 16:
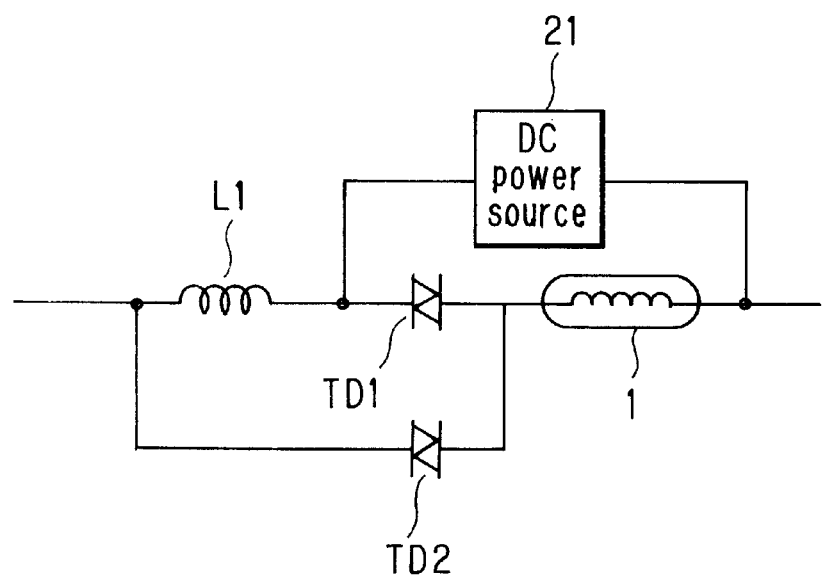
FIG. 16 is a diagram showing the basic configuration of the fixing heater control circuit in accordance with the sixth embodiment.
Figure 15:
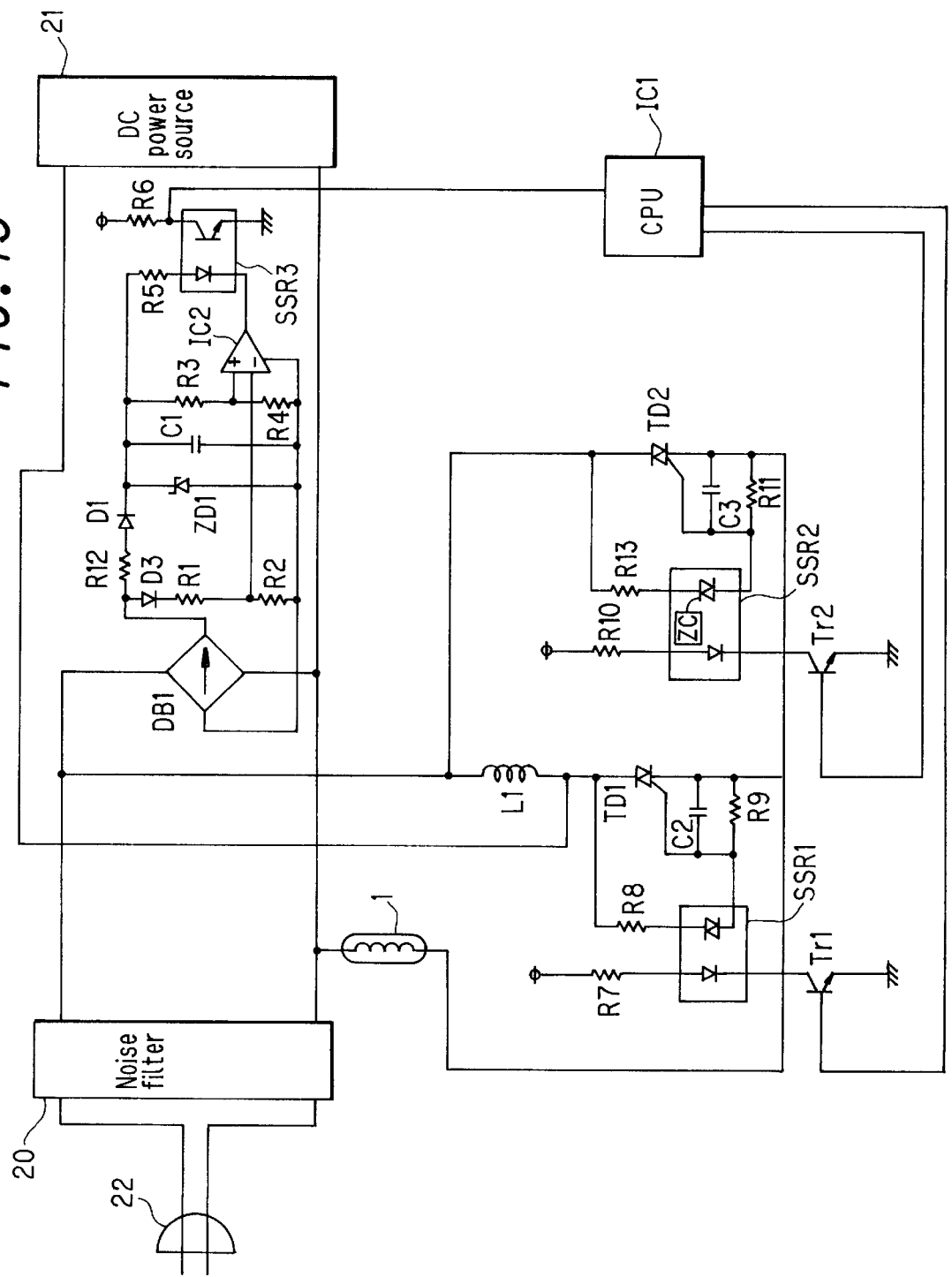
FIG. 15 is a block diagram showing the fixing heater control circuit in accordance with the sixth embodiment.

Referring to FIGS. 15 and 16, the sixth embodiment will be explained. FIG. 15 is a block diagram showing the fixing heater control circuit in accordance with the sixth embodiment. FIG. 16 is a diagram showing the bas Ic configuration of the fixing heater control circuit in accordance with the sixth embodiment.

In all the embodiments described above, reactor L1 has been used for performing soft start of fixing heater 1. In this embodiment, this reactor L1 is shared with the power source that has other loads which generate higher-harmonic current as shown in FIGS. 15 and 16, in order to further enhance the effect of reducing higher-harmonic current in the copier as a whole.

When, for example, a capacitor input type power source such as a switching power source, etc. is used for the d.c. power source for controlling the whole copier, higher-harmonic current also arises from the d.c. power source. Therefore, it is necessary to provide an individual reactor for the d.c. power source. In this case, however, it is possible to configure a series circuit of a reactor L1, triac TD1 and fixing heater 1, connected in this order while fixing heater 1 is grounded at the other end, and interpose the d.c. power source between the connection between reactor L1 and triac TD1 and the ground so as to prevent higher-harmonic current from occurring.

As has been described heretofore, in accordance with the sixth embodiment, reactor L1 can be used also as the reactor for the d.c. power source, eliminating the necessity of a separate countermeasure for the d.c. power source, thus making it possible to reduce the number of parts, the size and cost.

The 7th Embodiment

Figure 17:
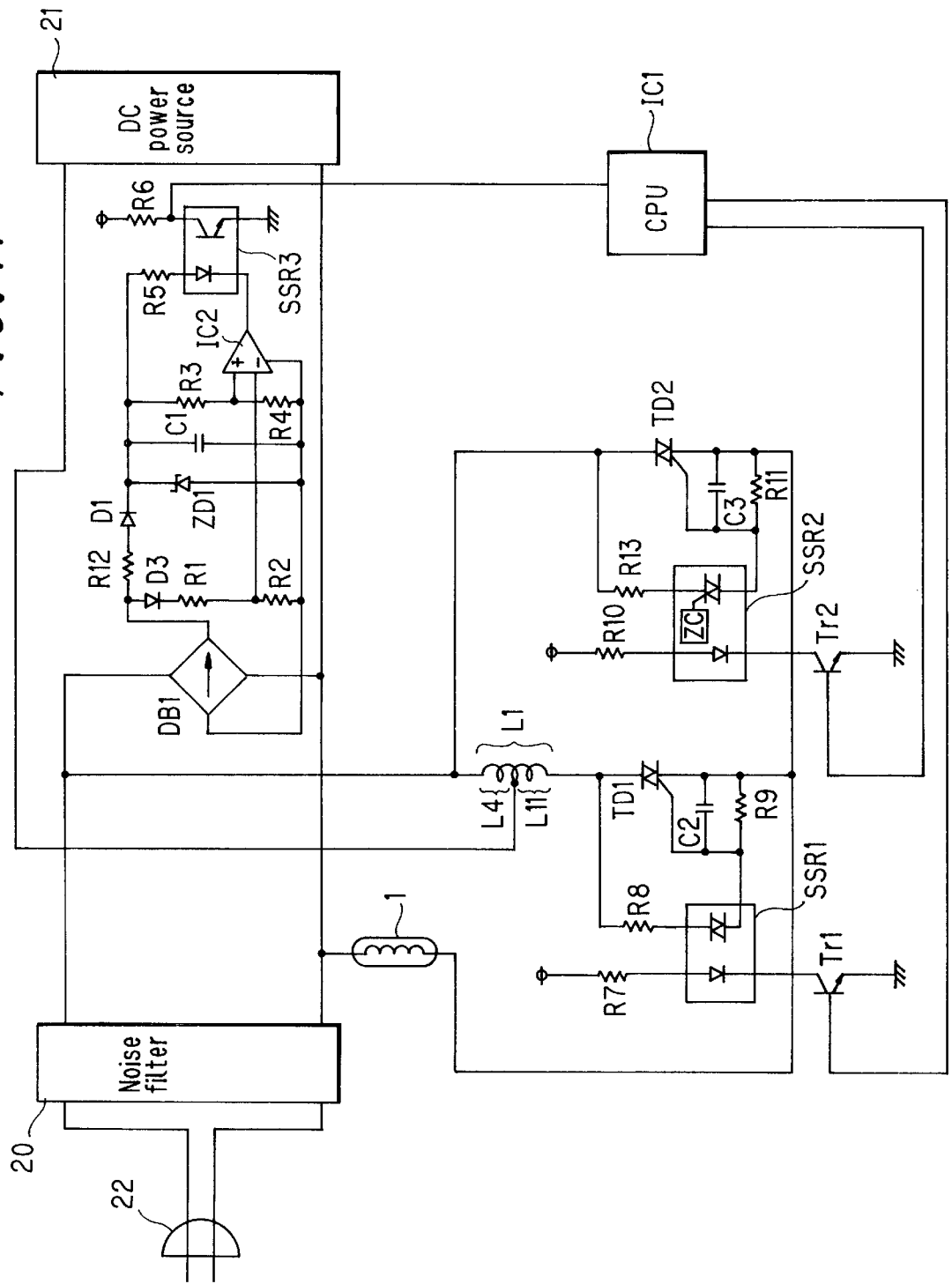
FIG. 17 is a block diagram showing the fixing heater control circuit in accordance with the seventh embodiment.
Figure 18:
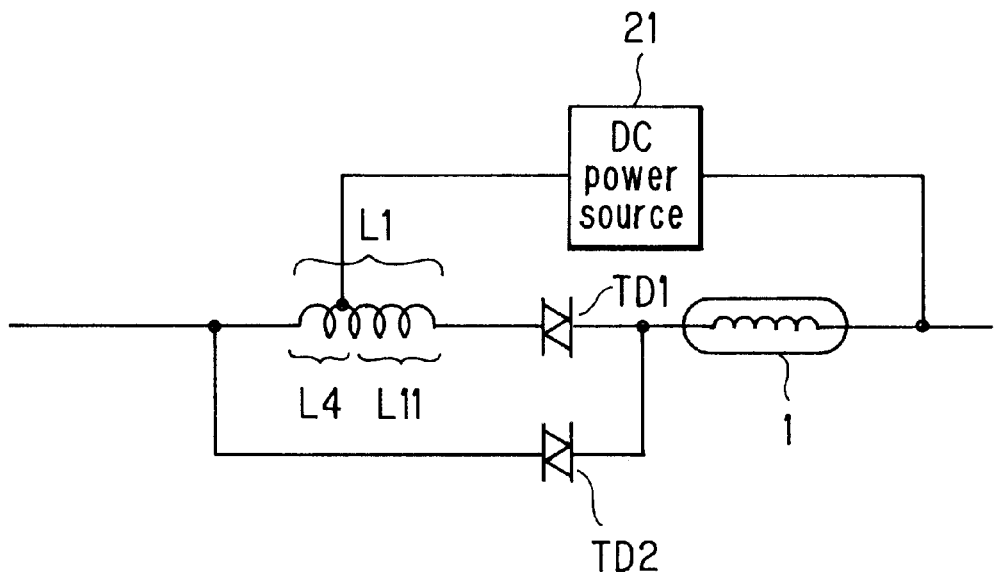
FIG. 18 is a diagram showing the basic configuration of the fixing heater control circuit in accordance with the seventh embodiment.

Referring to FIGS. 17 and 18, the seventh embodiment will be explained. FIG. 17 is a block diagram showing the fixing heater control circuit in accordance with the seventh embodiment. FIG. 18 is a diagram showing the basic configuration of the fixing heater control circuit in accordance with the seventh embodiment.

In the configuration shown in the sixth embodiment, a part of L4 of reactor L1 is used as the reactor for the d.c. power source as shown in FIGS. 17 and 18.

Since a large amount of current is consumed in fixing heater 1, the higher-harmonic current arising when the phase angle of current flow is controlled by triac TD1, is much greater than that arising at other loads. Hence an inductance much lower compared to this is adequate for the higher-harmonic current control for the d.c. power source. Therefore, partial use of L4 in reactor L1 is effective enough for this purpose.

As has been described heretofore, in accordance with the seventh embodiment, the average current for the whole reactor can be reduced, thus making the reactor more compact than in the case of the sixth embodiment, and hence making it possible to further reduce the size and cost of the copier.

The 8th Embodiment

Figure 20:
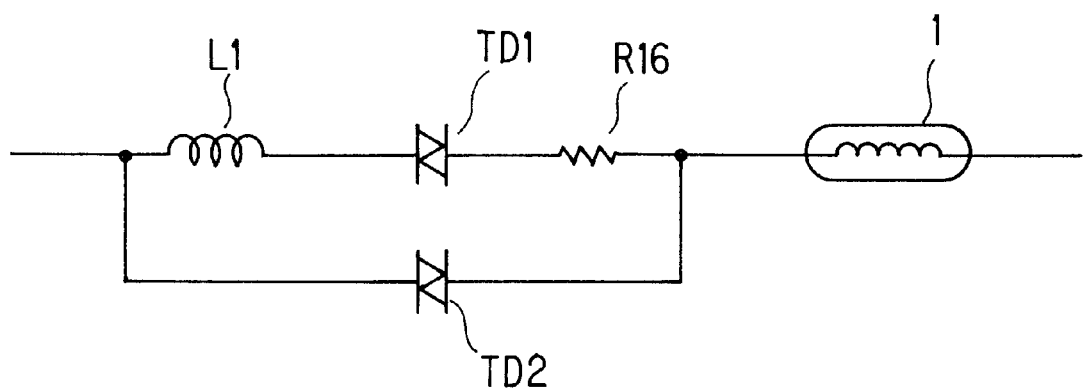
FIG. 20 is a diagram showing the basic configuration of the fixing heater control circuit in accordance with the eighth embodiment.
Figure 19:
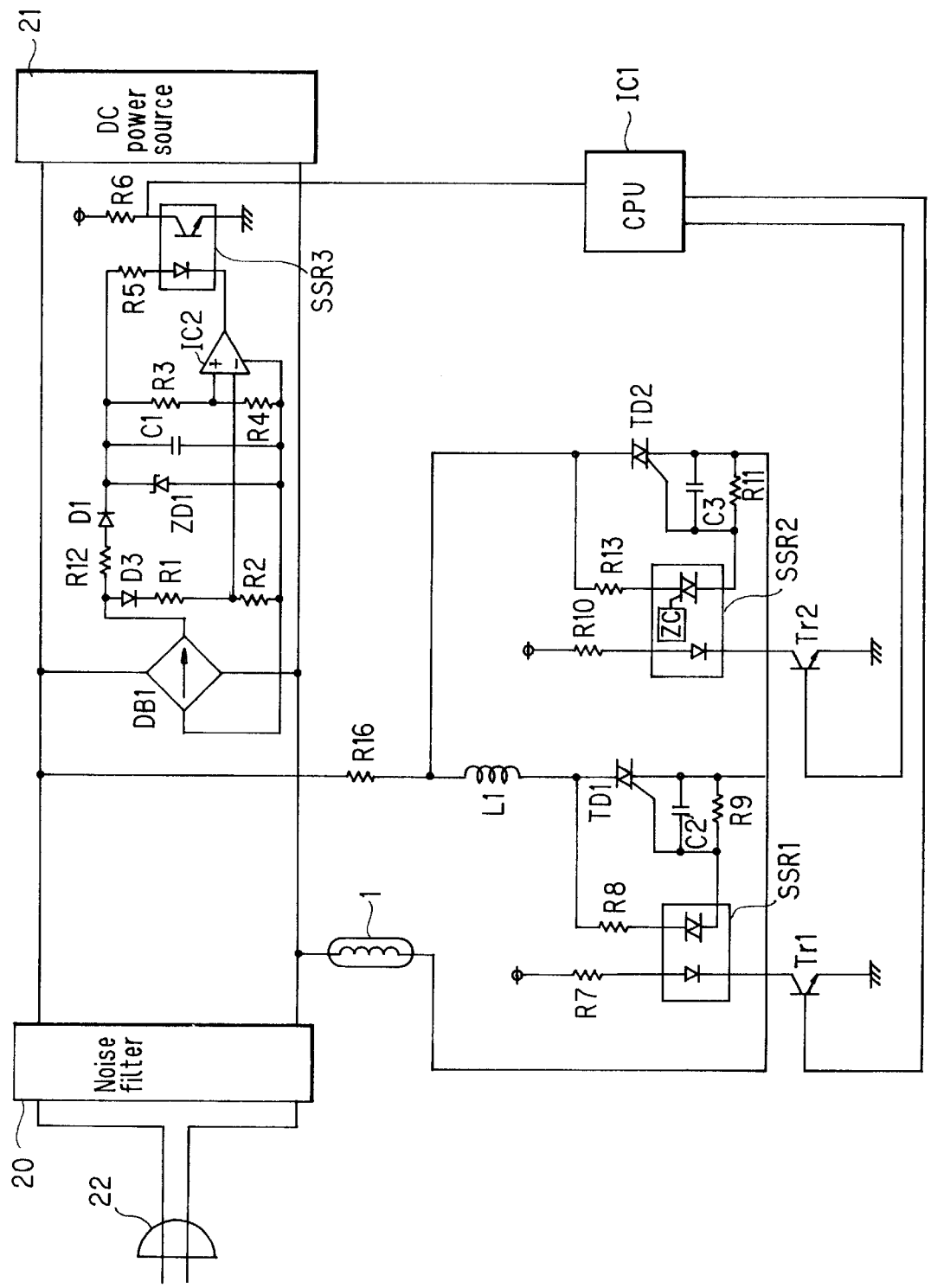
FIG. 19 is a block diagram showing the fixing heater control circuit in accordance with the eighth embodiment.

Referring to FIGS. 19 and 20, the eighth embodiment will be explained. FIG. 19 is a block diagram showing the fixing heater control circuit in accordance with the eighth embodiment. FIG. 20 is a diagram showing the basic configuration of the fixing heater control circuit in accordance with the eighth embodiment.

Generation of fluctuation or flicker from fixing heater 1 is attributed to the extreme lowness of the resistance of the lamp heater, such as a halogen lamp, when the temperature of the filament is low. Illustratively, the temperature of the filament is low when the heater is activated so that a rush current which is greater than the rated current occurs. As a countermeasure for eliminating fluctuation, the soft-start technique which controls the range of phase angle of current flow, is used as has been described in the first embodiment.

The eighth embodiment is an improvement of the first embodiment, and its circuit further includes, as seen in FIGS. 19 and 20, a resistor R16 interposed between the series of a reactor L1 and triac TD1, and fixing heater 1, so as to inhibit the rush current during activation of fixing heater 1 and hence prevent generation of fluctuation. Since current is made to flow through resistor R16 only during the soft-start operation, a resistor, which is of a type with a lower amount of heat generation and having a small rating, is effective enough. Further, since the average current of reactor L1 lowers, it is possible to further reduce the size of reactor L1.

Since a large current will flow through resistor R16, even though it is for very short period of time, it is preferable to use a resistor having a large rush current rating, such as a cement resistance type. Further, since this resistor R16 only needs to function while the filament of the fixing heater is low in temperature, it is possible to use a resistor such as a power thermistor etc. which has a large resistivity only when the temperature is low.

As has been described heretofore, in accordance with the eighth embodiment, the rush current at the time of activation of fixing heater 1 is reduced and hence fluctuation can be inhibited while reactor L1 can be reduced in size. Thus, it is possible to further reduce the size and cost of the device.

The 9th Embodiment

The control circuit of fixing heater 1 used in the ninth embodiment is the same as that shown in FIG. 4 of the first embodiment. Therefore, referring to this figure and FIG. 21 and 22, the control flow will be described.

Fluctuation becomes maximum when the power is turned on, or when the filament of fixing heater 1 is still cold, as mentioned above. The ninth embodiment takes measures against this situation. That is, this embodiment uses two classes of the control time for soft start, one longer and one shorter: the longer one is applied immediately after the power switch is turned on; and the shorter one is applied to the regular temperature control, i.e., when the filament of fixing heater 1 has already been warmed. It is also possible to use three or more classes of control time for soft start, to achieve a further fine control.

In a copier having a power-saving mode, if the machine has not been used for a predetermined period of time, fixing heater 1 will be turned off and automatically enter a sleep mode. When the reset key is pressed, fixing heater is turned on to warm up the system, thus restoring the ready state, i.e., the copy operable mode. The first soft start of fixing heater 1 to be performed when the machine is restored from the power-saving mode is adapted to be performed under the longer control of soft start. On the other hand, the shorter control of soft start is adapted to be performed after the temperature control has entered the regular mode.

Next, description will be made of the flow of temperature control for the ready state after the power switch has been turned on.

Figure 21:
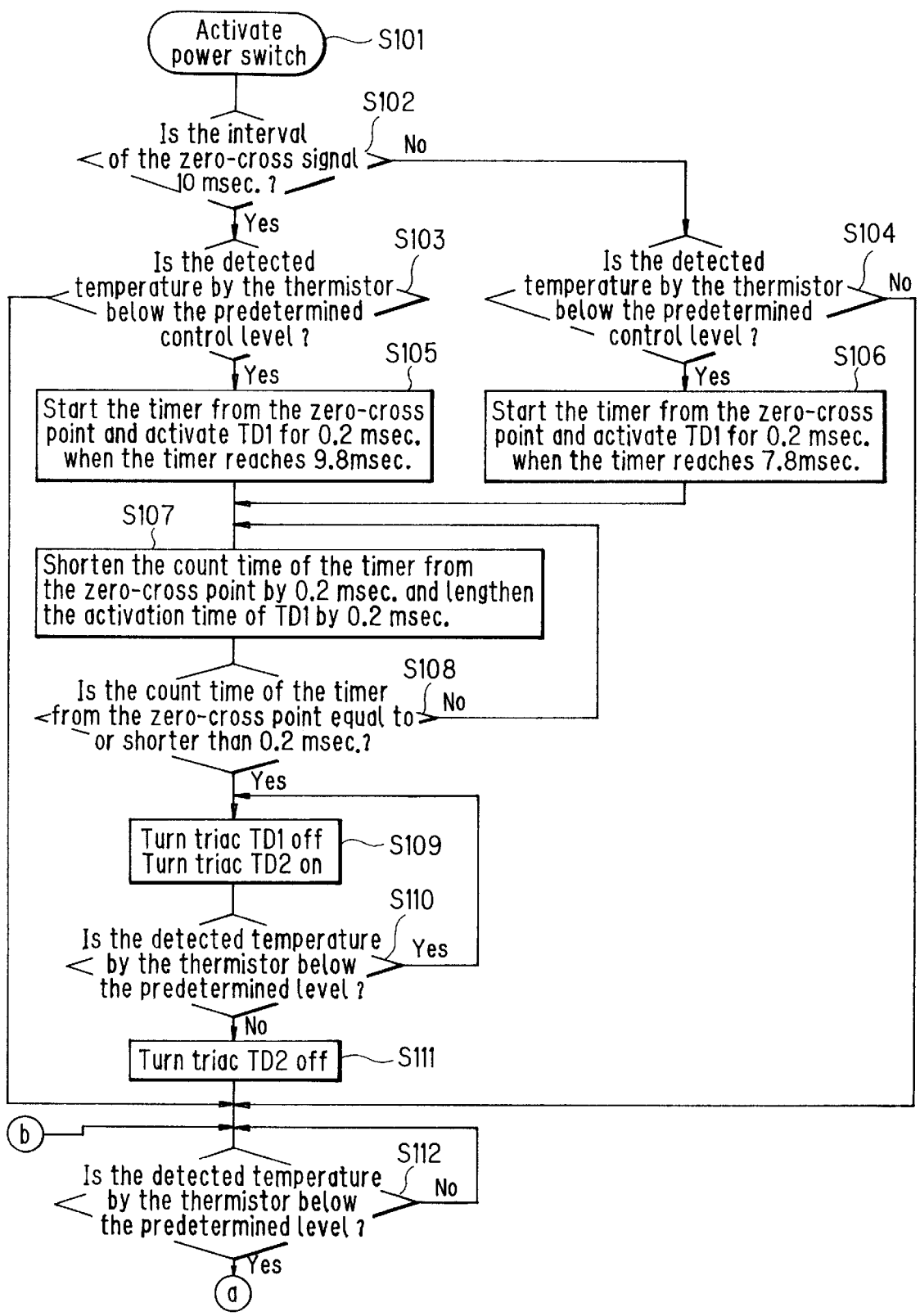
FIG. 21 is a flowchart in accordance with the ninth embodiment.
Figure 22:
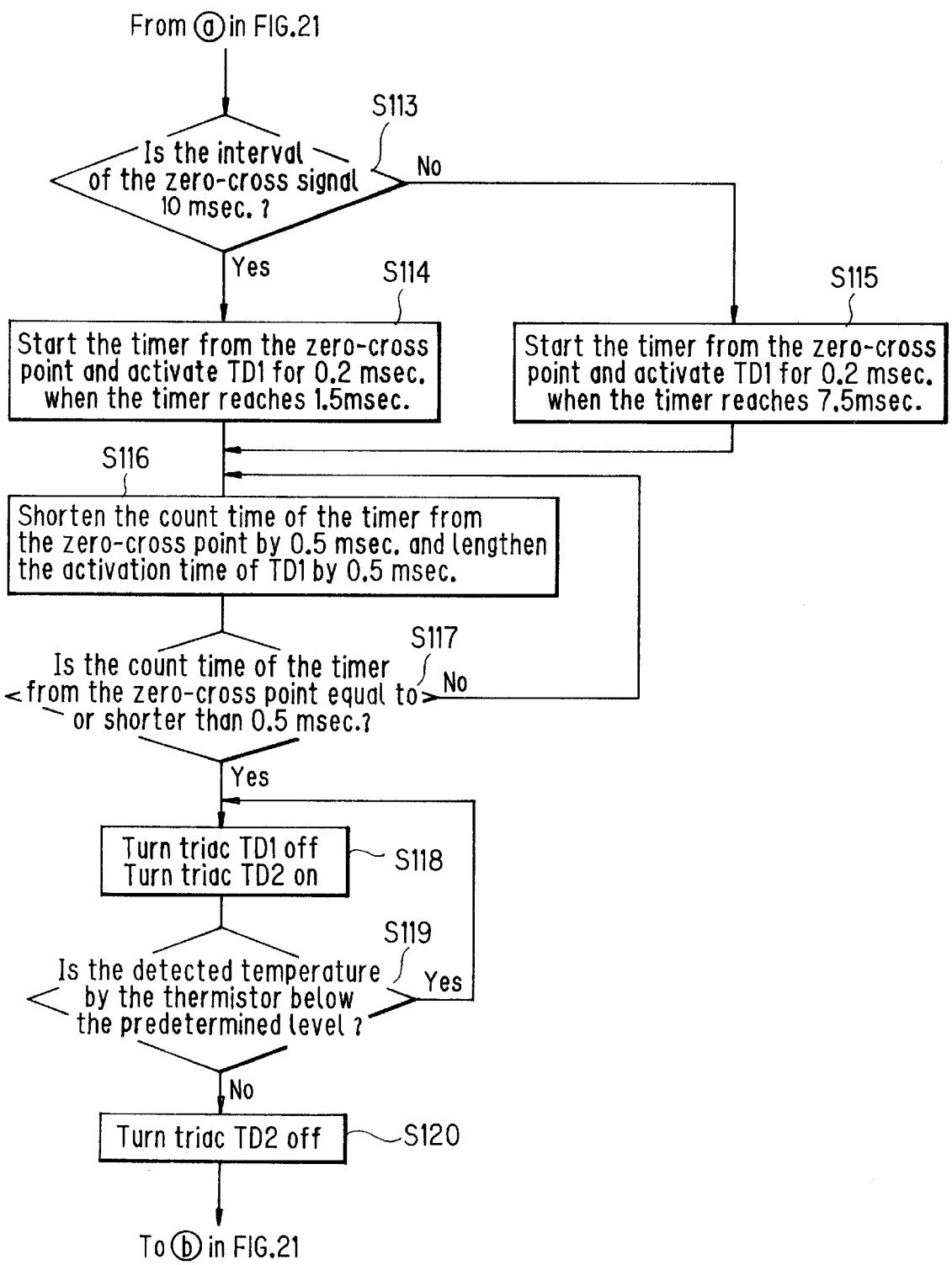
FIG. 22 is a flowchart showing the subsequent part of FIG. 21 in accordance with the ninth embodiment.

First, when, as shown in FIG. 21, the power switch is turned on (step S101), the d.c. power source starts to operate and CPU IC1 performs an initializing operation. Thereafter, CPU IC1 detects the signal of the zero-cross points in the a.c. input voltage that has been rectified through diode bridge DB1, by way of photocoupler SSR3, to thereby identify the interval of the zero-cross point signal (Step S102). If this interval is 10 msec., the a.c. input voltage is determined to have a frequency of 50 Hz, and the operation goes to Step S103 where the output voltage of thermistor 3 is read so as to judge whether the temperature is below the predetermined level. On the other hand, if the interval is 8 msec., the a.c. input is of 60 Hz and the operation goes to Step S104 where the output voltage of thermistor 3 is read so as to judge whether the temperature is below the predetermined level.

At Step S103 and Step S104, when the output voltage from thermistor 3 is determined to be above the predetermined level, or the temperature is above the threshold for temperature adjustment, the operation enters the ready state at Step S112.

On the other hand, if it is judged at Step S103 that the output voltage from thermistor 3 indicates a temperature below the predetermined level, fixing heater 1 starts to be heated. Since the frequency of the a.c. input voltage at this point is 50 Hz, the timer is started at the zero-cross point and when the count reaches 9.8 msec., an ON signal of 0.2 msec. is output to triac TD1 (Step S105). Then the operation goes to Step S107.

If it is judged at Step S104 that the output voltage from thermistor 3 indicates a temperature below the predetermined level, fixing heater 1 starts to be heated. Since the frequency of the a.c. input voltage at this mode is 60 Hz, the timer is started at the zero-cross point and when the count reaches 7.8 msec., an ON signal of 0.2 msec. is output to triac TD1 (Step S106). Then the operation goes to Step S107.

At Step S107, the count of the timer from the zero-cross point in the next half-cycle is made shorter by 0.2 msec. so as to output an ON signal with 0.2 msec. longer than the previous one. Thereafter, at Step S108, it is judged whether the time from the zero-cross point to the time when triac TD1 is turned on is equal to or shorter than 0.2 msec. Steps S107 and S108 are repeated until the judgment becomes affirmative (or the time becomes equal to or lower than 0.2 msec.).

When the time from the zero-cross point to the time when triac TD1 is turned on has become equal to or shorter than 0.2 msec., it is determined that the phase angle of the a.c. input voltage waveform has reached 180° so that triac TD1 is turned off and triac TD2 is activated at the zero-cross point (Step S109).

Next, it is judged whether the output voltage from thermistor 3 indicates a temperature below the predetermined level (Step S110). If the temperature is below the predetermined level, the operation returns to Step S109 where triac TD2 is kept in the ON state. On the other hand, if the temperature is above the predetermined level, triac TD2 is turned off (Step S111) and the operation enters the ready state at Step S112.

At Step S112, the output voltage from thermistor 3 is monitored, and when the output shows that the temperature has become lower than the predetermined level, fixing heater 1 is turned on in order to maintain the fixing roller at the required temperature. At Step S113, the a.c. input frequency is identified, either 50 Hz or 60 Hz. When it is 50 Hz, the timer is started at the zero-cross point and when the count reaches 9.5 msec., an ON signal of 0.2 msec. is output to triac TD1 (Step S114). On the other hand, when it is 60 Hz, the timer is started at the zero-cross point and when the count reaches 7.5 msec., an ON signal of 0.2 msec. is output to triac TD1 (Step S114).

At Step S116, the count of the timer from the zero-cross point in the next half-cycle is made shorter by 0.5 msec. so as to output an ON signal which is 0.5 msec. longer than the previous one. Thereafter, at Step S117, it is judged whether the time from the zero-cross point to the time when triac TD1 is turned on is equal to or shorter than 0.5 msec. Steps S116 and S117 are repeated until the judgment becomes affirmative (or the time becomes equal to or lower than 0.5 msec.).

When the time from the zero-cross point to the time when triac TD1 is turned on has become equal to or shorter than 0.5 msec., it is determined that the phase angle of the a.c. input voltage waveform has reached 180° so that triac TD1 is turned off and triac TD2 is activated at the zero-cross point (Step S118).

Next, it is judged whether the output voltage from thermistor 3 indicates a temperature below the predetermined level (Step S119). If the temperature is below the predetermined level, the operation returns to Step S118 where triac TD2 is kept in the ON state. On the other hand, if the temperature is above the predetermined level, triac TD2 is turned off (Step S120) and the operation returns to Step S112 for the ready state.

In the above flow of operations, two classes of soft start control are selectively used. By this method, if the frequency of the a.c. input voltage is 50 Hz for example, it takes 50 msec. to achieve the soft start control for the case when the power switch is activated. On the other hand, when the regular temperature control is performed, it is possible to achieve the soft start control of 20 msec.

As has been described above, in accordance with the ninth embodiment, it is possible to shorten the time for phase angle control of current flow, and also it is possible to suppress the generation of heat from reactor L1 when the power is activated while the size and cost of the device can be reduced.

The 10th Embodiment

Figure 23:
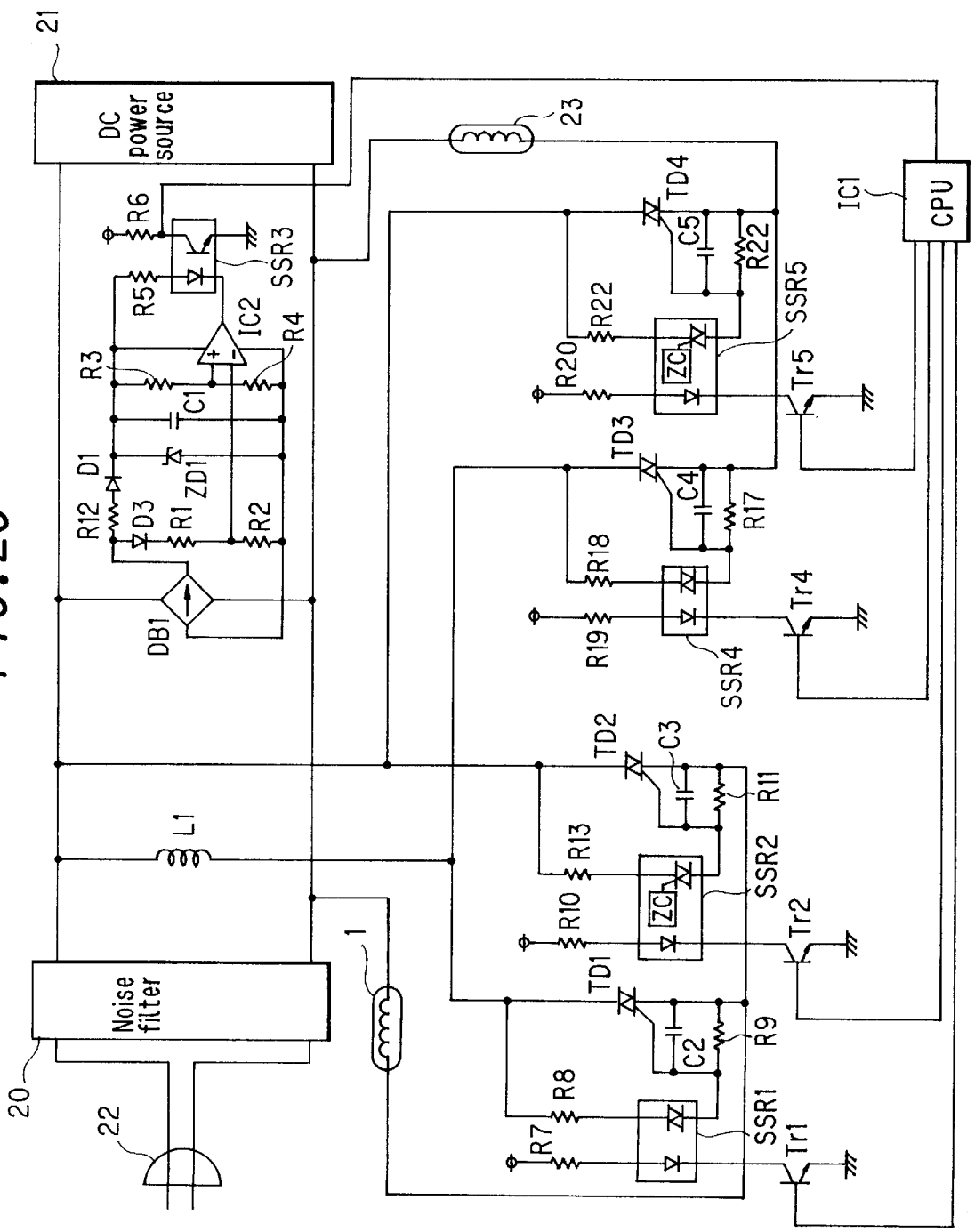
FIG. 23 is a block diagram showing the fixing heater control circuit in accordance with the tenth embodiment.
Figure 24:
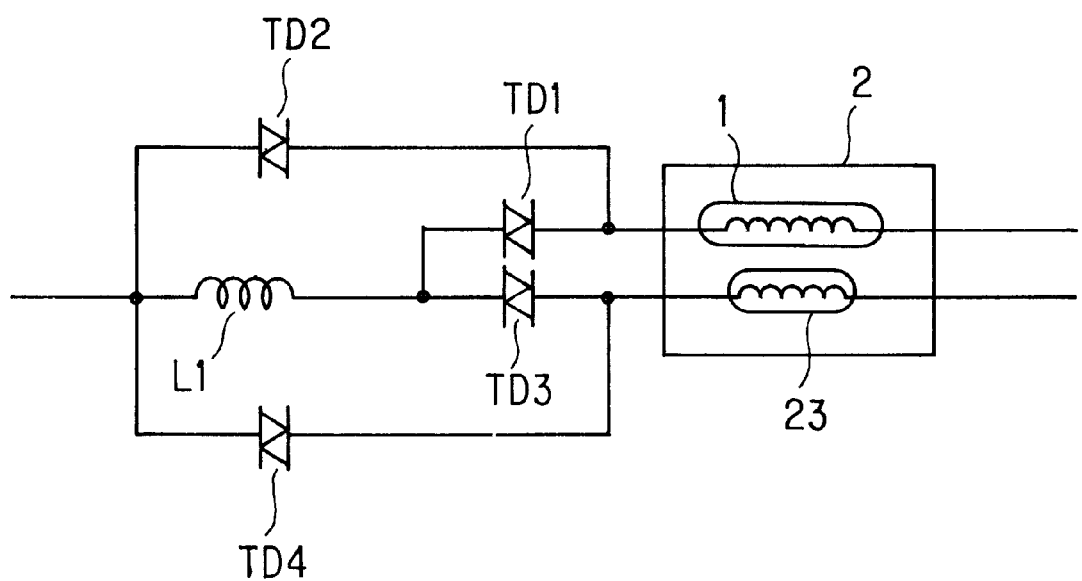
FIG. 24 is a diagram showing the basic configuration of the fixing heater control circuit in accordance with the tenth embodiment.

Referring to FIGS. 23 and 24, the tenth embodiment will be explained. FIG. 23 is a block diagram showing the fixing heater control circuit in accordance with the tenth embodiment. FIG. 24 is a diagram showing the basic configuration of the fixing heater control circuit in accordance with the tenth embodiment.

In this embodiment, the power consumption of the copier is reduced by having a fixing unit which includes two fixing heaters 1 and 23 each having a different power rating from the other, wherein both the fixing heaters 1 and 23 are activated at warm-up mode while the temperature control is performed only with fixing heater 23 having a smaller power rating under the temperature control mode. In this copier, the control circuit includes: triacs TD1 and TD3 engaging in soft start of respective fixing heaters 1 and 23 based on the phase angle control of the a.c. input voltage; triacs TD2 and TD4 which are turned on at zero-cross points of the a.c. input voltage waveform; and a reactor L1 which is commonly used with triacs TD1 and TD3 for regulating higher-harmonic current.

At the beginning of the warm-up of fixing heater 1 when operation is restored from the power-saving mode, fixing heater 23 having a smaller power rating is soft started based on the phase angle control of the a.c. input voltage, using triac TD3. During this, higher-harmonic current is reduced by reactor L1. When the phase angle of the current through triac TD3 has becomes 180°, triac TD3 is turned off and triac TD4 is turned on at the zero-cross point on the a.c. input voltage waveform.

After triac TD4 is activated, fixing heater 23 having a larger power rating is soft started based on the phase angle control of the a.c. input voltage, using triac TD1. During this, higher-harmonic current is reduced by reactor L1. When the phase angle of the current through triac TD1 has becomes 180°, triac TD1 is turned off and triac TD2 is turned on at the zero-cross point on the a.c. input voltage waveform. Thereafter, when thermistor 3 detects that the fixing roller 2 has reached the predetermined level of temperature, the triac TD2 is turned off. The subsequent regular temperature control is performed using only fixing heater 23 having a smaller rated power.

Since the time required for the soft start operation based on the phase angle control of the a.c. input voltage is very short, the average current flowing through reactor L1 for control of higher-harmonic current is not so great even if it is commonly used for fixing heaters 1 and 23. Accordingly, this configuration performs its operation with a reactor L1 of limited size and rate.

As has been described heretofore, in accordance with the tenth embodiment, fixing heaters 1 and 23 are both used so as to reduce the time for warm-up and the consumption energy. Further, since fixing heater 23 having a smaller power rating is mainly used for the temperature control of fixing roller 2, the rush current itself generated during temperature control is low and repetitions of activation of the fixing heater is reduced in number. Therefore, it is possible not only to reduce fluctuation but also reduce the time for the soft start operation and generation of higher-harmonic current.

In accordance with the first aspect of the invention, the heater is connected in series with a parallel circuit consisting of the reactor and the first phase control switch in series and the second phase control switch, and the first phase control switch is adapted to be used only for the period of the soft start at the initial stage of activation of the heater and the second phase control switch is used for illumination after the range of the phase angle of current flow has been maximized. Therefore, it is possible to limit the average current through the reactor to a low level, and hence the device can be reduced in size and cost.

In accordance with the second aspect of the invention, the waveform of the current through the reactor is detected so as to correct the phase delay due to the inductance of the reactor, whereby the phase angle of the current through first phase control switch is controlled. Therefore, it is possible to perform further delicate soft start of the heater, and hence to reduce fluctuation to a lower level.

In accordance with the third aspect of the invention, the output signal from the secondary winding of the reactor is monitored so as to facilitate the anomaly detection of the first phase control switch.

In accordance with the fourth aspect of the invention, it is possible to perform improved reduction of the higher-harmonic current without unnecessarily enlarging the total size of the reactor component, as well as performing anomaly detection of the second phase control switch.

In accordance with the fifth aspect of the invention, the effect of reducing the higher-harmonic current is enhanced and the output signal from the secondary winding is monitored so as to facilitate the anomaly detection of the first and second phase control switches.

In accordance with the sixth aspect of the invention, the reactor can be used also as the reactor for the d.c. power source, eliminating the necessity of a separate countermeasure for the d.c. power source, thus making it possible to reduce the number of parts, the size and cost.

In accordance with the seventh aspect of the invention, the average current for the whole reactor can be reduced, thus making the reactor further compact, and hence making it possible to further reduce the size and cost of the copier.

In accordance with the eighth aspect of the invention, the rush current at the time of activation of the heater is reduced and hence fluctuation can be inhibited while the reactor can be reduced in size. Thus, it is possible to further reduce the size and cost of the device.

In accordance with the ninth aspect of the invention, it is possible to shorten the time for phase angle control of current flow, and also it is possible to suppress the generation of heat from the reactor when the power is activated while the size and cost of the device can be reduced.

In accordance with the tenth aspect of the invention, the first and second heaters are both used so as to reduce the time for warm-up and the consumption energy. Further, since the second heater having a smaller power rating is mainly used for the temperature control of the fixing roller, the rush current itself generated during temperature control is low and repetitions of activation of the heater is reduced in number. Therefore, it is possible not only to reduce fluctuation but also reduce the time for the soft start operation and generation of higher-harmonic current.

What is claimed is:

1. A heater control device for controlling a heater based on phase angle control, comprising:

a heater control circuit comprising a series circuit of a first phase control switch and a reactor and a second phase control switch connected in parallel with the series circuit, the heater control circuit being connected in series with a heater;

a detecting means for detecting the zero-cross points in the waveform of an a.c. input voltage supplied to the heater; and a phase angle control means, which based on the detection output of the zero-cross points from a detecting means, gradually alters a phase angle of current flow from the minimum range to the maximum range, characterized in that the phase angle control means performs control in such a manner that only the first phase control switch is turned on until the phase angle of the current flow reaches 180° and then only the second phase control switch is turned on after the phase angle of the current flow has reached 180°.

2. The heater control device according to claim 1, wherein:

the reactor has a secondary winding wound on the common core;

the detecting means detects the zero-cross points from an output voltage from the secondary winding;

a timer means is provided for measuring time, starting the measurement at a zero-cross point on the a.c. input voltage waveform detected by detecting means; and the first phase control switch performs phase angle control, by gradually altering the phase angle of current flow from the minimum range to the maximum range, based on the measured time from the timer means.

3. The heater control device according to claim 1, wherein the reactor has a secondary winding wound on the common core, further comprising an anomaly detecting means for detecting an anomaly of the first phase control switch, based on an output voltage from the secondary winding.

4. A heater control device for controlling a heater based on phase angle control, comprising:

a heater control circuit comprising a series circuit of a first phase control switch and a reactor and a second phase control switch which shares in part a winding of the reactor and is connected in parallel with the series circuit, the heater control circuit being connected in series with a heater;

a detecting means for detecting the zero-cross points in the waveform of an a.c. input voltage supplied to the heater; and a phase angle control means, which based on the detection output of the zero-cross points from the detecting means, gradually alters the phase angle of current flow from a minimum range to a maximum range, characterized in that the phase angle control means performs control in such a manner that only the first phase control switch is turned on until the phase angle of the current flow reaches 180° and then only the second phase control switch is turned on after the phase angle of the current flow has reached 180°.

5. The heater control device according to claim 4, wherein the reactor has a secondary winding wound on a common core, further comprising an anomaly detecting means for detecting an anomaly of the first phase control switch and the second phase control switch, based on an output voltage from the secondary winding.

6. The heater control device according to claim 1, wherein a load which generates higher-harmonic current is adapted to be connected in parallel with the series circuit of the first phase control switch and the heater.

7. The heater control device according to claim 1, wherein a load which generates higher-harmonic current is connected at a midway point of a winding of the reactor so that the load is connected in parallel with the series circuit of a part of the reactor, the first phase control switch and the heater.

8. A heater control device for controlling a heater based on phase angle control, comprising:

a heater control circuit comprising of a series circuit of a reactor, a first phase control switch and a resistor and a second phase control switch in parallel with the series circuit, the heater control circuit being connected in series with a heater;

a detecting means for detecting the zero-cross points in the waveform of an a.c. input voltage supplied to the heater; and a phase angle control means, which based on the detection output of the zero-cross points from the detecting means, gradually alters the phase angle of current flow from the minimum range to a maximum range, characterized in that the phase angle control means performs control in such a manner that only the first phase control switch is turned on until the phase angle of the current flow reaches 180° and then only the second phase control switch is turned on after the phase angle of the current flow has reached 180°.

9. The heater control device according to claim 1, wherein the first phase control switch has two classes of operation time during which the first phase control switch is changed over to the second phase control switch, so that when the heater is cold, the operation time of the first phase control switch for altering the phase angle of current flow from the minimum range to the maximum range is made long, whereas when in the regular temperature condition, the operation time is made short.

10. A heater control device for controlling a heater based on phase angle control, comprising:

a first heater control circuit comprising a first series circuit of a first phase control switch and a reactor and a second phase control switch connected in parallel with the first series circuit, the first heater control circuit being connected in series with a first heater;

a first detecting means for detecting the zero-cross points in the waveform of an a.c. input voltage supplied to the first heater;

a phase angle control means, which based on the detection output of the zero-cross points from the first detecting means, gradually alters the phase angle of the current flowing through the first phase control switch, from a minimum range to a maximum range, wherein the phase angle control means performs control in such a manner that only the first phase control switch is turned on until the phase angle of the current flow reaches 180° and then only the second phase control switch is turned on after the phase angle of the current flow has reached 180°;

a second heater control circuit comprising a second series circuit of a third phase control switch and a reactor and a fourth phase control switch connected in parallel with the second series circuit, the second heater control circuit being connected in series with a second heater;

a second detecting means for detecting the zero-cross points in the waveform of an a.c. input voltage supplied to the second heater; and a phase angle control means, which based on the detection output of the zero-cross points from the second detecting means, gradually alters the phase angle of the current flowing through the third phase control switch, from a minimum range to a maximum range, wherein the phase angle control means performs control in such a manner that only the third phase control switch is turned on until the phase angle of the current flow reaches 180° and then only the fourth phase control switch is turned on after the phase angle of the current flow has reached 180°.

11. A heater control device for controlling a heater supplied with an a.c. input voltage, said heater control device comprising:

a heater control circuit comprising a series circuit including a first phase control switch and a reactor, and a second phase control switch connected in parallel with the series circuit;

a detecting circuit configured to detect zero-cross points in the waveform of the a.c. input voltage supplied to said heater; and a phase angle control circuit configured to control a phase of current to said heater based on detections of zero-cross points by said detecting circuit, wherein said phase angle control circuit controls the phase of the current to said heater by turning on only said first phase control switch until the phase of the current reaches 180°, turning off said first phase control switch when the phase of the current reaches 180°, and then turning on only said second phase control switch after the phase of the current reaches 180°.

12. The heater control device according to claim 11, further comprising a timer, wherein said reactor comprises a secondary winding, said detecting circuit is configured to detect the zero-cross points based on an output voltage of said secondary winding, said timer measures time starting from zero-cross points detected by said detecting circuit, and said first phase control switch is controlled based on the time measured by said timer.

13. The heater control device according to claim 12, further comprising:

a relay connected between the a.c. input voltage and said heater, said phase angle control circuit being further configured to open said relay in response to detection of an operation anomaly.

14. The heater control device according to claim 13, wherein the detection of an operation anomaly is based on the output voltage of said secondary winding.

15. The heater control device according to claim 11, further comprising:

a high-harmonic current-generating load connected in parallel with said first phase control switch and said heater.

16. The heater control device according to claim 11, further comprising:

a high-harmonic current-generating load connected in parallel with a series connection of said first phase control switch, said heater and a part of said reactor.

17. The heater control device according to claim 11, wherein said series circuit further comprises a resistor.

18. A heater control device for controlling a heater supplied with an a.c. input voltage, said heater control device comprising:

a heater control circuit comprising a series circuit including a first phase control switch and a reactor, and a second phase control switch connected in parallel with a series connection of said first phase control switch and a part of said reactor;

a detecting circuit configured to detect zero-cross points in the waveform of the a.c. input voltage supplied to said heater; and a phase angle control circuit configured to control the phase of the current to said heater based on detections of zero-cross points by said detecting circuit, wherein said phase angle control circuit controls the phase of the current to said heater by turning on only said first phase control switch until the phase of the current reaches 180°, turning off said first phase control switch when the phase of the current reaches 180° and then turning on only said second phase control switch after the phase angle of the current flow has reached 180°.

19. The heater control device according to claim 18, further comprising:

a relay connected between the a.c. input voltage and said heater, wherein said reactor comprises a secondary winding and said relay is controlled in accordance with a detection of an operation anomaly based on an output voltage of said secondary winding.

* * * * *